United States Patent
Olson et al.

(10) Patent No.: US 11,729,540 B2
(45) Date of Patent: Aug. 15, 2023

(54) WATER IMMUNE USER-ACTUATABLE TOUCH CONTROL FOR AN EAR-WORN ELECTRONIC DEVICE

(71) Applicant: Starkey Laboratories, Inc., Eden Prairie, MN (US)

(72) Inventors: Kyle Olson, St. Louis Park, MN (US); Sidney A. Higgins, Maple Grove, MN (US); Brad Guertin, Roseville, MN (US)

(73) Assignee: Starkey Laboratories, Inc., Eden Prairie, MN (US)

( * ) Notice: Subject to any disclaimer, the term of this patent is extended or adjusted under 35 U.S.C. 154(b) by 41 days.

(21) Appl. No.: 17/553,729

(22) Filed: Dec. 16, 2021

(65) Prior Publication Data

US 2023/0199365 A1    Jun. 22, 2023

(51) Int. Cl.
*H04R 25/00* (2006.01)
*H04R 1/10* (2006.01)
*G06F 3/01* (2006.01)

(52) U.S. Cl.
CPC .......... *H04R 1/1041* (2013.01); *G06F 3/015* (2013.01); *G06F 3/016* (2013.01); *H04R 1/1091* (2013.01); *H04R 2420/07* (2013.01)

(58) Field of Classification Search
CPC ..... H04R 1/1041; H04R 1/1091; G06F 3/015; G06F 3/016
See application file for complete search history.

(56) References Cited

U.S. PATENT DOCUMENTS

| | | | |
|---|---|---|---|
| 4,955,729 A | 9/1990 | Marx | |
| 6,821,249 B2 | 11/2004 | Casscells, III et al. | |
| 8,885,856 B2 | 11/2014 | Sacha | |
| 9,060,233 B2 | 6/2015 | Shennib et al. | |
| 9,579,060 B1 * | 2/2017 | Lisy | A61B 5/16 |
| 9,794,699 B2 | 10/2017 | Choi et al. | |

(Continued)

FOREIGN PATENT DOCUMENTS

| | | |
|---|---|---|
| EP | 3627854 | 3/2020 |
| KR | 20160100065 | 8/2016 |

(Continued)

OTHER PUBLICATIONS

International Search Report and Written Opinion from PCT Application No. PCT/US2021/030147 dated Aug. 2, 2021, 15 pages.

*Primary Examiner* — Simon King
(74) *Attorney, Agent, or Firm* — Mueting Raasch Group

(57) ABSTRACT

An ear-worn electronic device comprises a housing configured to be worn in, at or about an ear of a wearer, electronic circuitry disposed in or supported by the housing, a controller disposed in the housing and coupled to the electronic circuitry, and a rechargeable power source and charging circuitry respectively disposed in the housing. The charging circuitry is coupled to the controller and comprises first and second charge contacts situated at a wall of the housing. A user-actuatable control is operatively coupled to the controller and comprises a touch sensor coupled to the first and second charge contacts. The touch sensor comprises a threshold detector configured to distinguish between skin contact with the first and second charge contacts and contact between a conductive material more conductive than skin and the first and second charge contacts.

24 Claims, 12 Drawing Sheets

(56) References Cited

U.S. PATENT DOCUMENTS

| | | |
|---|---|---|
| 9,826,318 B2 | 11/2017 | Pedersen et al. |
| 9,843,870 B2 | 12/2017 | Naumann |
| 10,251,603 B2 | 4/2019 | Geva et al. |
| 10,506,310 B2 | 12/2019 | Aumer et al. |
| 10,873,798 B1 | 12/2020 | Jackson et al. |
| 11,570,538 B1 * | 1/2023 | Briggs .................... H04R 5/04 |
| 2013/0195295 A1 | 8/2013 | Van Halteren et al. |
| 2014/0275888 A1 | 9/2014 | Wegerich et al. |
| 2014/0321682 A1 | 10/2014 | Kofod-Hansen et al. |
| 2017/0079586 A1 | 3/2017 | Geva et al. |
| 2017/0199643 A1 | 7/2017 | Schnyder et al. |
| 2019/0327550 A1 | 10/2019 | Lindén et al. |
| 2019/0373377 A1 | 12/2019 | Larsen et al. |
| 2019/0380597 A1 | 12/2019 | Howard |

FOREIGN PATENT DOCUMENTS

| | | |
|---|---|---|
| KR | 20160102848 | 8/2016 |
| WO | 2009/118221 | 10/2009 |

* cited by examiner

WATER IMMUNE USER-ACTUATABLE
TOUCH CONTROL FOR AN EAR-WORN
ELECTRONIC DEVICE

TECHNICAL FIELD

This application relates generally to ear-level electronic systems and devices, including hearing devices, personal amplification devices, hearing aids, hearables, physiologic monitoring devices, biometric devices, position and/or motion sensing devices, and other ear-worn electronic devices.

SUMMARY

Embodiments are directed to an ear-worn electronic device comprises a housing configured to be worn in, at or about an ear of a wearer, electronic circuitry disposed in or supported by the housing, a controller disposed in the housing and coupled to the electronic circuitry, and a rechargeable power source and charging circuitry respectively disposed in the housing. The charging circuitry is coupled to the controller and comprises first and second charge contacts situated at a wall of the housing. A user-actuatable control is operatively coupled to the controller and comprises a touch sensor coupled to the first and second charge contacts. The touch sensor comprises a threshold detector configured to distinguish between skin contact with the first and second charge contacts and contact between a conductive material more conductive than skin and the first and second charge contacts.

Embodiments are directed to an ear-worn electronic device comprising a housing configured to be worn in, at or about an ear of a wearer, electronic circuitry disposed in or supported by the housing, a controller disposed in the housing and coupled to the electronic circuitry, and a rechargeable power source and charging circuitry respectively disposed in the housing. The charging circuitry is coupled to the controller and comprises first and second charge contacts situated at a wall of the housing. A user-actuatable control is operatively coupled to the controller and comprises a touch sensor coupled to the first and second charge contacts. The touch sensor comprises a threshold detector configured to distinguish between a first, a second, and a third range of impedances respectively present at the first and second charge contacts, and generate a touch signal in response to detecting the first range of impedances present at the first and second charge contacts.

Embodiments are directed to a method implemented by an ear-worn electronic device comprising sensing a touch event of unknown origin by a touch sensor of the device, and activating a threshold detector in response to sensing the touch event. The method also comprises distinguishing, by the threshold detector, between skin contact with the touch sensor and contact between a conductive material more conductive than skin and the touch sensor. The method further comprises and initiating a device function or operation in response to the threshold detector detecting skin contact with the touch sensor.

Embodiments are directed to an ear-worn electronic device comprising a housing configured to be worn in, at or about an ear of a wearer. Audio processing circuitry is disposed in or supported by the housing and comprises one or more microphones and a speaker or a receiver. A controller is disposed in the housing and coupled to the audio processing circuitry. A rechargeable power source and charging circuitry are disposed in the housing. The charging circuitry is coupled to the controller and comprises first and second charge contacts situated at a wall of the housing. A user-actuatable control is coupled to the controller and comprises a touch sensor. The touch sensor comprises the first and second charge contacts.

Embodiments are directed to an ear-worn electronic device comprising a housing configured to be worn in, at or about an ear of a wearer. Electronic circuitry is disposed in or supported by the housing. A controller is disposed in the housing and coupled to the electronic circuitry. A rechargeable power source and charging circuitry are disposed in the housing. The charging circuitry is coupled to the controller and comprises first and second charge contacts situated at a wall of the housing. A user-actuatable control is coupled to the controller and comprises a touch sensor. The touch sensor comprises the first and second charge contacts.

Embodiments are directed to an ear-worn electronic device comprising a housing configured to be worn in, at or about an ear of a wearer. Audio processing circuitry is disposed in or supported by the housing and comprises one or more microphones and a speaker or a receiver. A controller is disposed in the housing and coupled to the audio processing circuitry. A rechargeable power source and charging circuitry are disposed in the housing. The charging circuitry is coupled to the controller and comprises first and second charge contacts situated at a wall of the housing. A user-actuatable control is coupled to the controller and comprises a touch sensor. The touch sensor comprises the first and second charge contacts and at least one auxiliary sensor coupled to the first and second charge contacts.

Embodiments are directed to an ear-worn electronic device comprising a housing configured to be worn in, at or about an ear of a wearer. Electronic circuitry is disposed in or supported by the housing. A controller is disposed in the housing and coupled to the electronic circuitry. A rechargeable power source and charging circuitry are disposed in the housing. The charging circuitry is coupled to the controller and comprises first and second charge contacts situated at a wall of the housing. A user-actuatable control is coupled to the controller and comprises a touch sensor. The touch sensor comprises the first and second charge contacts and at least one auxiliary sensor coupled to the first and second charge contacts.

Embodiments are directed to an ear-worn electronic device comprising a housing configured to be worn in, at or about an ear of a wearer. Audio processing circuitry is disposed in or supported by the housing and comprises one or more microphones and a speaker or a receiver. A controller is disposed in the housing and coupled to the audio processing circuitry. A rechargeable power source and charging circuitry are disposed in the housing. The charging circuitry is coupled to the controller and comprises first and second charge contacts situated at a wall of the housing. A user-actuatable control is coupled to the controller and comprises a touch sensor. The touch sensor comprises the first and second charge contacts and at least one auxiliary sensor coupled to the controller.

Embodiments are directed to an ear-worn electronic device comprising a housing configured to be worn in, at or about an ear of a wearer. Electronic circuitry is disposed in or supported by the housing. A controller is disposed in the housing and coupled to the electronic circuitry. A rechargeable power source and charging circuitry are disposed in the housing. The charging circuitry is coupled to the controller and comprise first and second charge contacts situated at a wall of the housing. A user-actuatable control is coupled to the controller and comprises a touch sensor. The touch sensor comprises the first and second charge contacts and at least one auxiliary sensor coupled to the controller.

Embodiments are directed to an ear-worn electronic device comprising a housing configured to be worn in, at or about an ear of a wearer. Audio processing circuitry is disposed in or supported by the housing and comprises one or more microphones and a speaker or a receiver. A controller is disposed in the housing and coupled to the audio processing circuitry. A rechargeable power source and charging circuitry are disposed in the housing. The charging circuitry is coupled to the controller and comprises a charger interface. The charger interface can be configured for wired or wireless charging. A user-actuatable control is coupled to the controller and comprises a touch sensor.

Embodiments are directed to an ear-worn electronic device comprising a housing configured to be worn in, at or about an ear of a wearer. Electronic circuitry is disposed in or supported by the housing. A controller is disposed in the housing and coupled to the electronic circuitry. A rechargeable power source and charging circuitry are disposed in the housing. The charging circuitry is coupled to the controller and comprises a charger interface. The charger interface can be configured for wired or wireless charging. A user-actuatable control is coupled to the controller and comprises a touch sensor.

Embodiments are directed to an ear-worn electronic device comprising a housing configured to be worn in, at or about an ear of a wearer. Audio processing circuitry is disposed in or supported by the housing and comprises one or more microphones and a speaker or a receiver. A controller is disposed in the housing and coupled to the audio processing circuitry. A rechargeable power source and charging circuitry are disposed in the housing. The charging circuitry is coupled to the controller and comprises a charger interface. The charger interface can be configured for wired or wireless charging. A user-actuatable control is coupled to the controller and comprises a touch sensor. The touch sensor comprises at least one auxiliary sensor.

Embodiments are directed to an ear-worn electronic device comprising a housing configured to be worn in, at or about an ear of a wearer. Electronic circuitry is disposed in or supported by the housing. A controller is disposed in the housing and coupled to the electronic circuitry. A rechargeable power source and charging circuitry are disposed in the housing. The charging circuitry is coupled to the controller and comprises a charger interface. The charger interface can be configured for wired or wireless charging. A user-actuatable control is coupled to the controller and comprises a touch sensor. The touch sensor comprises at least one auxiliary sensor.

Embodiments are directed to a method implemented by an ear-worn electronic device comprising sensing, by a touch sensor of the ear-worn electronic device, a touch input resulting from one or more events of contact between the touch sensor and a finger of a wearer of the device. The method comprises generating, by the touch sensor, a touch signal in response to the touch input. The method also comprises receiving the touch signal by a controller of the device. The method further comprises implementing, by the controller, a device setting, function or operation in response to the received touch signal.

The above summary is not intended to describe each disclosed embodiment or every implementation of the present disclosure. The figures and the detailed description below more particularly exemplify illustrative embodiments.

BRIEF DESCRIPTION OF THE DRAWINGS

Throughout the specification reference is made to the appended drawings wherein.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1:
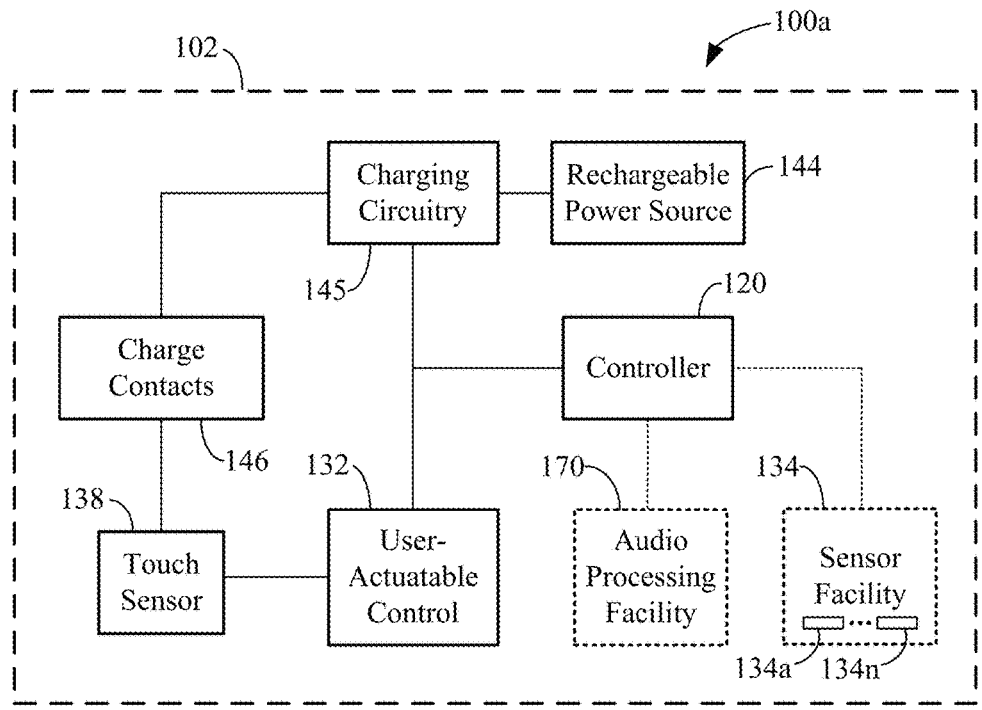
FIG. 1 is a block diagram of an ear-worn electronic device which includes a user-actuatable control comprising a touch sensor in accordance with any of the embodiments disclosed herein.

Conventional hearing devices typically rely on an electromechanical switch or push button to increase volume, change memory presets, or turn the device on or off. While the component cost itself is modest, the method of assembly and retention adds cost and complex assembly procedures. A conventional electromechanical switch or push button is a point of ingress for electrostatic discharge (ESD) and foreign materials, and also reduces waterproofing. To date, inertial measurement unit (IMU) switching, capacitive touch, and other methods of solid-state actuation have proven either too complex or prone to false actuation.

Embodiments of the disclosure are directed to an ear-worn electronic device which includes a user-actuatable control comprising a touch sensor. The term ear-worn electronic device (e.g., device 100a, 100b, 100c, 100d, 100e, 100f shown in the figures) refers to a wide variety of electronic devices configured for deployment in, on or about an ear of a wearer. Representative ear-worn electronic devices of the present disclosure include, but are not limited to, in-the-canal (ITC), completely-in-the-canal (CIC), invisible-in-canal (IIC), in-the-ear (ITE), receiver-in-canal (RIC), behind-the-ear (BTE), and receiver-in-the-ear (RITE) type devices. Representative ear-worn electronic devices of the present disclosure include, but are not limited to, earbuds, electronic ear plugs, personal sound amplification devices, and other ear-worn electronic appliances. Ear-worn electronic devices of the present disclosure include various types of hearing devices, various types of physiologic monitoring and biometric devices, and combined hearing/physiologic monitoring devices. Ear-worn electronic devices of the present disclosure include restricted medical devices (e.g., devices regulated by the U.S. Food and Drug Administration), such as hearing aids. Ear-worn electronic devices of the present disclosure include consumer electronic devices, such as consumer earbuds, consumer sound amplifiers, and consumer hearing devices (e.g., consumer hearing aids and over-the-counter (OTC) hearing devices), for example.

Embodiments of the invention are defined in the claims. However, below there is provided a non-exhaustive listing of non-limiting examples. Any one or more of the features of these examples may be combined with any one or more features of another example, embodiment, or aspect described herein.

Example Ex1. An ear-worn electronic device comprises a housing configured to be worn in, at or about an ear of a wearer. Audio processing circuitry is disposed in or supported by the housing and comprises one or more microphones and a speaker or a receiver. A controller is disposed in the housing and coupled to the audio processing circuitry. A rechargeable power source and charging circuitry are disposed in the housing. The charging circuitry is coupled to the controller and comprises first and second charge contacts situated at a wall of the housing. A user-actuatable control is coupled to the controller and comprises a touch sensor. The touch sensor comprises the first and second charge contacts.

Example Ex2. An ear-worn electronic device comprises a housing configured to be worn in, at or about an ear of a wearer. Electronic circuitry is disposed in or supported by the housing. A controller is disposed in the housing and coupled to the electronic circuitry. A rechargeable power source and charging circuitry are disposed in the housing. The charging circuitry is coupled to the controller and comprises first and second charge contacts situated at a wall of the housing. A user-actuatable control is coupled to the controller and comprises a touch sensor. The touch sensor comprises the first and second charge contacts.

Example Ex3. An ear-worn electronic device comprises a housing configured to be worn in, at or about an ear of a wearer. Audio processing circuitry is disposed in or supported by the housing and comprises one or more microphones and a speaker or a receiver. A controller is disposed in the housing and coupled to the audio processing circuitry. A rechargeable power source and charging circuitry are disposed in the housing. The charging circuitry is coupled to the controller and comprises first and second charge contacts situated at a wall of the housing. A user-actuatable control is coupled to the controller and comprises a touch sensor. The touch sensor comprises the first and second charge contacts and at least one auxiliary sensor coupled to the first and second charge contacts.

Example Ex4. A ear-worn electronic device comprises a housing configured to be worn in, at or about an ear of a wearer. Electronic circuitry is disposed in or supported by the housing. A controller is disposed in the housing and coupled to the electronic circuitry. A rechargeable power source and charging circuitry are disposed in the housing. The charging circuitry is coupled to the controller and comprises first and second charge contacts situated at a wall of the housing. A user-actuatable control is coupled to the controller and comprises a touch sensor. The touch sensor comprises the first and second charge contacts and at least one auxiliary sensor coupled to the first and second charge contacts.

Example Ex5. An ear-worn electronic device comprises a housing configured to be worn in, at or about an ear of a wearer. Audio processing circuitry is disposed in or supported by the housing and comprises one or more microphones and a speaker or a receiver. A controller is disposed in the housing and coupled to the audio processing circuitry. A rechargeable power source and charging circuitry are disposed in the housing. The charging circuitry is coupled to the controller and comprises first and second charge contacts situated at a wall of the housing. A user-actuatable control is coupled to the controller and comprises a touch sensor. The touch sensor comprises the first and second charge contacts and at least one auxiliary sensor coupled to the controller.

Example Ex6. An ear-worn electronic device comprises a housing configured to be worn in, at or about an ear of a wearer. Electronic circuitry is disposed in or supported by the housing. A controller is disposed in the housing and coupled to the electronic circuitry. A rechargeable power source and charging circuitry are disposed in the housing. The charging circuitry is coupled to the controller and comprise first and second charge contacts situated at a wall of the housing. A user-actuatable control is coupled to the controller and comprises a touch sensor. The touch sensor comprises the first and second charge contacts and at least one auxiliary sensor coupled to the controller.

Example Ex7. The device according to one or more of Ex1 to Ex6, wherein the touch sensor is configured to sense for a change in an electrical or electrodermal property of skin in contact with the first and second charge contacts.

Example Ex8. The device according to Ex7, wherein the electrical or electrodermal property comprises one or any combination of impedance, conductance, resistance, and electrodermal activity.

Example Ex9. The device according to one or more of Ex3 to Ex8, wherein the auxiliary sensor comprises a temperature sensor.

Example Ex10. The device according to one or more of Ex3 to Ex8, wherein the auxiliary sensor comprises a thermistor.

Example Ex11. The device according to one or more of Ex3 to Ex8, wherein the auxiliary sensor comprises a thermocouple, a bimetallic temperature sensor, a resistance temperature detector or a semiconductor-based temperature sensor.

Example Ex12. The device according to one or more of Ex3 to Ex8, wherein the auxiliary sensor comprises one or more of a motion sensor, an electrical sensor, an electrodermal activity sensor, and a physiologic sensor.

Example Ex13. The device according to one or more of Ex3 to Ex8, wherein the auxiliary sensor comprises a temperature sensor and at least one of a motion sensor, an electrical sensor, an electrodermal activity sensor, and a physiologic sensor.

Example Ex14. The device according to one or more of Ex9 to Ex13, wherein the auxiliary sensor is situated at a location of the housing adjacent to, or between, the first and second charge contacts.

Example Ex15. The device according to one or more of Ex9 to Ex13, wherein the auxiliary sensor is situated at a location of the housing spaced away from the first and second charge contacts.

Example Ex16. The device according to one or more of Ex2, Ex4, and Ex6, wherein the electronic circuitry comprises a sensor facility and the sensor facility comprises one or more physiologic or biometric sensors.

Example Ex17. The device according to one or more of Ex1, Ex3, and Ex5, comprising a sensor facility, wherein the sensor facility comprises one or more physiologic or biometric sensors.

Example Ex18. The device according to Ex17, wherein the sensor facility comprises one or more of a motion sensor, an electrical sensor, and an electrodermal activity sensor.

Example Ex19. The device according to one or more of Ex1 to Ex18, wherein the controller is configured to initiate a device setting, function or operation in response to a touch input to the touch sensor by the wearer.

Example Ex20. The device according to one or more of Ex1 to Ex18, wherein the controller is configured to initiate a plurality of disparate device functions or operations in response to a corresponding plurality of touch inputs to the touch sensor by the wearer.

Example Ex21. The device according to one or more of Ex1 to Ex20, comprising an activation sensor disposed in or on the housing and coupled to the controller, the activation sensor configured to generate an activation signal in response to wearer contact with the housing wherein the controller is configured to initiate a device setting, function or operation in response to the activation signal and a touch input to the touch sensor by the wearer.

Example Ex22. The device according to Ex21, wherein the activation sensor comprises at least one of a motion sensor and an electrical sensor.

Example Ex23. The device according to Ex22, wherein the at least one motion sensor comprises at least one of an inertial measurement unit, a single- or multiple-axis gyro sensor, and a single- or multiple-axis accelerometer sensor, and the at least one electrical sensor comprises at least a capacitive sensor.

Example Ex24. A method implemented by an ear-worn electronic device comprises sensing, by a touch sensor of the ear-worn electronic device, a touch input resulting from one or more events of contact between the touch sensor and a finger of a wearer of the device; generating, by the touch sensor, a touch signal in response to the touch input; receiving the touch signal by a controller of the device; and implementing, by the controller, a device setting, function or operation in response to the received touch signal.

Example Ex25. The method according to Ex24, wherein the touch sensor comprises charge contacts of the ear-worn electronic device.

Example Ex26. The method according to Ex24, wherein the touch sensor comprises contacts of the ear-worn electronic device other than charge contacts of the ear-worn electronic device.

Example Ex27. The method according to Ex24, wherein the method comprises any one or any combination of processes recited in one or more of Ex1 to Ex23.

Example Ex28. The method according to Ex24, wherein the method comprises any one or any combination of processes and components recited in one or more of Ex1 to Ex23.

Example Ex29. An ear-worn electronic device comprises a housing configured to be worn in, at or about an ear of a wearer. Audio processing circuitry is disposed in or supported by the housing and comprises one or more microphones and a speaker or a receiver. A controller is disposed in the housing and coupled to the audio processing circuitry. A rechargeable power source and charging circuitry are disposed in the housing. The charging circuitry is coupled to the controller and comprises a charger interface. The charger interface can be configured for wired or wireless charging. A user-actuatable control is coupled to the controller and comprises a touch sensor.

Example Ex30. An ear-worn electronic device comprises a housing configured to be worn in, at or about an ear of a wearer. Electronic circuitry is disposed in or supported by the housing. A controller is disposed in the housing and coupled to the electronic circuitry. A rechargeable power source and charging circuitry are disposed in the housing. The charging circuitry is coupled to the controller and comprises a charger interface. The charger interface can be configured for wired or wireless charging. A user-actuatable control is coupled to the controller and comprises a touch sensor.

Example Ex31. An ear-worn electronic device comprises a housing configured to be worn in, at or about an ear of a wearer. Audio processing circuitry is disposed in or supported by the housing and comprises one or more microphones and a speaker or a receiver. A controller is disposed in the housing and coupled to the audio processing circuitry. A rechargeable power source and charging circuitry are disposed in the housing. The charging circuitry is coupled to the controller and comprises a charger interface. The charger interface can be configured for wired or wireless charging. A user-actuatable control is coupled to the controller and comprises a touch sensor. The touch sensor comprises at least one auxiliary sensor.

Example Ex32. An ear-worn electronic device comprises a housing configured to be worn in, at or about an ear of a wearer. Electronic circuitry is disposed in or supported by the housing. A controller is disposed in the housing and coupled to the electronic circuitry. A rechargeable power source and charging circuitry are disposed in the housing. The charging circuitry is coupled to the controller and comprises a charger interface. The charger interface can be configured for wired or wireless charging. A user-actuatable control is coupled to the controller and comprises a touch sensor. The touch sensor comprises at least one auxiliary sensor.

Example Ex33. The device according to one or more of Ex29 to Ex32, wherein the touch sensor comprises charge contacts of the charger interface.

Example Ex34. The device according to one or more of Ex29 to Ex32, wherein the touch sensor comprises contacts of the ear-worn electronic device other than charge contacts of the charger interface.

Example Ex35. The device according to one or more of Ex29 to Ex32, wherein the charger interface comprises a wireless charger interface.

Example Ex36. The device according to one or more of Ex29 to Ex32, wherein the charger interface comprises an inductive, a radio frequency or an optical charger interface.

Example Ex37. The device according to one or more of Ex1 to Ex23 and Ex29 to Ex36, wherein the user-actuatable control is configured to effect cycling through device settings in response to wearer inputs to the user-actuatable control.

Example Ex38. The device according to Ex37, wherein the wearer input is a single tap or a series of single taps to the user-actuatable control.

Example Ex39. The device according to Ex37, wherein the wearer input is a double tap or a series of double taps to the user-actuatable control.

Example Ex40. The device according to Ex37, wherein the wearer input is a multiple tap or a series of multiple taps to the user-actuatable control.

Example Ex41. The device according to one or more of Ex1 to Ex23 and Ex29 to Ex36, wherein the user-actuatable control is configured, in response to sensing a double tap or a multiple tap, to one or both of enable and disable one or more device settings or device functions.

Example Ex42. The device according to Ex41, wherein the one or more device settings or device functions comprise one or more of active noise cancelation, a BLE pairing mode, an automatic vent facility, and output of an audio message, an audio signal, an optical signal or an electromagnetic signal.

Example Ex43. The device according to one or more of Ex1 to Ex23 and Ex29 to Ex36, wherein the user-actuatable control is configured, in response to sensing a first press having a first duration longer than a duration of a tap, to activate one or more of (a) a device setting or a plurality of device setting settings and (b) a device function or a plurality of device functions.

Example Ex44. The device according to Ex43, wherein the user-actuatable control is configured, in response to sensing a second press having a second duration longer than the first duration, to activate one or more of (a) a device setting or a plurality of device setting settings and (b) a device function or a plurality of device functions.

Example Ex45. The device according to Ex43 or Ex44, wherein the first duration is longer than about 1 second.

Example Ex46. The device according to Ex43 or Ex44, wherein the first duration is about 1.5 seconds.

Example Ex47. The device according to Ex44, wherein the second duration is longer than about 2.5 seconds.

Example Ex48. The device according to Ex44, wherein the second duration is longer than about 3 seconds.

Example Ex49. The device according to Ex44, wherein the second duration is about 3 to 4 seconds.

Example Ex50. The device according to one or more of Ex42 to Ex49, wherein the user-actuatable control is configured, in response to sensing the first press, to activate one or more of (a) a device setting or a plurality of device setting settings and (b) a device function or a plurality of device functions.

Example Ex51. The device according to one or more of Ex42 to Ex50, wherein the user-actuatable control is configured, in response to sensing the second press, to turn the device on and/or off.

Example Ex52. The device according to one or more of Ex1 to Ex23 and Ex29 to Ex36, wherein:
the user-actuatable control is configured, in response to sensing a multiple tap, to open a menu of one or both of device settings and function options for a predetermined period of time or for as long as wearer taps are occurring; and
the user-actuatable control is configured to effect cycling through one or both of the device settings and the function options in response to sensing single taps.

Example Ex53. A system comprising a first ear-worn electronic device and a second ear-worn electronic device according to one or more of Ex1 to Ex23 and Ex29 to Ex36, wherein:
the first and second ear-worn electronic devices each comprises the user-actuatable control; and
the user-actuatable control of the first ear-worn electronic device has the same wearer input response functionality as the user-actuatable control of the second ear-worn electronic device.

Example Ex54. A system comprising a first ear-worn electronic device and a second ear-worn electronic device according to one or more of Ex1 to Ex23 and Ex29 to Ex36, wherein:
the first and second ear-worn electronic devices each comprises the user-actuatable control; and
the user-actuatable control of the first ear-worn electronic device has a different wearer input response functionality as the user-actuatable control of the second ear-worn electronic device.

Example Ex55. An ear-worn electronic device comprises a housing configured to be worn in, at or about an ear of a wearer. Electronic circuitry is disposed in or supported by the housing. A controller is disposed in the housing and coupled to the electronic circuitry. A rechargeable power source and charging circuitry are respectively disposed in the housing. The charging circuitry is coupled to the controller and comprising first and second charge contacts situated at a wall of the housing. A user-actuatable control is operatively coupled to the controller and comprises a touch sensor coupled to the first and second charge contacts. The touch sensor comprises a threshold detector configured to distinguish between skin contact with the first and second charge contacts and contact between a conductive material more conductive than skin and the first and second charge contacts.

Example Ex56. The device of Ex55, wherein the touch sensor, via the threshold detector, is configured to generate a touch signal in response to detection of contact between skin and the first and second charge contacts, and to inhibit generation of the touch signal in response to detection of contact between the conductive material and the first and second charge contacts.

Example Ex57. The device according to Ex55, wherein the threshold detector is configured to distinguish between (1) contact between skin and the first and second charge contacts, (2) contact between the conductive material and the first and second charge contacts; and (3) absence of a touch event at the first and second charge contacts.

Example Ex58. The device according to one or more of Ex55 to Ex57, wherein, in response to detecting a touch event of unknown origin at the first and second charge contacts, the threshold detector is configured to distinguish between skin contact with the first and second charge contacts and contact between the conductive material and the first and second charge contacts.

Example Ex59. The device according to Ex58, wherein the controller, in response to detection of the touch event of unknown origin, enables activation of the threshold detector to distinguish between at least a first range of impedances and a second range of impedances present at the first and second charge contacts.

Example Ex60. The device according to Ex59, wherein the first range of impedances corresponds to impedances associated with skin contact with the first and second charge contacts, and the second range of impedances corresponds to impedances associated with the conductive material.

Example Ex61. The device according to Ex60, wherein the first range of impedances comprises impedances of about 100K Ohm to about 300 M Ohm, and the second range of impedances comprises impedances of less than about 100K Ohm.

Example Ex62. The device according to one or more of Ex56 to Ex61, wherein the threshold detector is configured to generate a toggle signal between high and low states in response to the first range of impedances present at the first and second charge contacts, and generate a continuous high signal in response to the second range of impedances present at the first and second charge contacts.

Example Ex63. The device according to one or more of Ex56 to Ex61, wherein the threshold detector is configured to generate a continuous low signal in response to a third range of impedances present at the first and second charge contacts, and the third range of impedances is greater than the first and second ranges of impedances.

Example Ex64. The device according to one or more of Ex55 to Ex63, wherein the controller is configured to initiate a device function or operation in response to skin contact with the first and second charge contacts.

Example Ex65. The device according to one or more of Ex55 to Ex64, wherein the controller is configured to initiate a plurality of disparate device functions or operations in response to a corresponding plurality of skin contact events at the first and second charge contacts.

Example Ex66. An ear-worn electronic device comprises a housing configured to be worn in, at or about an ear of a wearer. Electronic circuitry is disposed in or supported by the housing. A controller is disposed in the housing and coupled to the electronic circuitry. A rechargeable power source and charging circuitry are respectively disposed in the housing. The charging circuitry is coupled to the controller and comprises first and second charge contacts situated at a wall of the housing. A user-actuatable control is operatively coupled to the controller and comprises a touch sensor coupled to the first and second charge contacts. The touch sensor comprises a threshold detector configured to distinguish between a first, a second, and a third range of impedances respectively present at the first and second charge contacts, and generate a touch signal in response to detecting the first range of impedances present at the first and second charge contacts.

Example Ex67. The device according to Ex66, wherein the threshold detector is configured to inhibit generation of the touch signal in response to detecting presence of the second and third ranges of impedances at the first and second charge contacts, respectively.

Example Ex68. The device according to Ex66, wherein the first range of impedances corresponds to impedances associated with skin contact with the first and second charge contacts, the second range of impedances corresponds to impedances associated with a conductive aqueous solution present at the first and second charge contacts, and the third range of impedances corresponds to impedances associated with an absence of a contact event at the first and second charge contacts.

Example Ex69. The device according to one or more of Ex66 to Ex68, wherein the first range of impedances comprises impedances of about 100K Ohm to about 300 M Ohm, the second range of impedances comprises impedances of less than about 100K Ohm, and the third range of impedances comprises impedances of greater than about 300 M Ohm.

Example Ex70. A method implemented by an ear-worn electronic device comprises sensing a touch event of unknown origin by a touch sensor of the device, activating a threshold detector in response to sensing the touch event, distinguishing, by the threshold detector, between skin contact with the touch sensor and contact between a conductive material more conductive than skin and the touch sensor, and initiating a device function or operation in response to the threshold detector detecting skin contact with the touch sensor. The following discussion is directed to the ear-worn electronic device 100*a*, 100*b*, 100*c*, 100*d*, 100*e*, 100*f* shown in FIGS. 1-7 and 9A-10. The device 100*a*, 100*b*, 100*c*, 100*d*, 100*e*, 100*f* includes a user-actuatable control comprising a touch sensor in accordance with any of the embodiments disclosed herein. In some implementations, the device 100*a*, 100*b*, 100*c*, 100*d*, 100*e*, 100*f* can be deployed in, on or about one ear of the wearer (e.g., left or right ear). In other implementations, a first device 100*a*, 100*b*, 100*c*, 100*d*, 100*e*, 100*f* can be deployed in, on or about the wearer's left ear, and a second device 100*a*, 100*b*, 100*c*, 100*d*, 100*e*, 100*f* can be deployed in, on or about the wearer's right ear. The first and second devices 100*a*, 100*b*, 100*c*, 100*d*, 100*e*, 100*f* can operate cooperatively (e.g., via an inductive or radio frequency ear-to-ear link) or independently. A user-actuatable control comprising a touch sensor can be incorporated in one of the two devices 110*a*, 100*b*, 100*c*, 100*d*, 100*e*, 100*f* or each of the two devices 100*a*, 100*b*, 100*c*, 100*d*, 100*e*, 100*f*. In some implementations, a controller that operates on touch inputs by a wearer can be incorporated in only one of two devices 100*a*, 100*b*, 100*c*, 100*d*, 100*e*, 100*f*, and changes to device operation responsive to the touch inputs can be communicated to the other device 100*a*, 100*b*, 100*c*, 100*d*, 100*e*, 100*f* for implementation by one or both of the devices 100*a*, 100*b*, 100*c*, 100*d*, 100*e*, 100*f*.

The ear-worn electronic device 100*a*, 100*b*, 100*c*, 100*d*, 100*e*, 100*f* shown in FIGS. 1-7 and 9A-10 includes a housing 102 configured for deployment in, on or about an ear of a wearer. According to any of the embodiments disclosed herein, the housing 102 can be configured for deployment at least partially within the wearer's ear. For example, the housing 102 can be configured for deployment at least partially or entirely within an ear canal of the wearer's ear. In some configurations, the shape of the housing 102 can be customized for the wearer's ear canal (e.g., based on a mold taken from the wearer's ear canal). In other configurations, the housing 102 can be constructed from pliant (e.g., semisoft) material that, when inserted into the wearer's ear canal, takes on the shape of the ear canal.

In accordance with any of the embodiments disclosed herein, the device 100a, 100b, 100c, 100d, 100e, 100f can be configured as a hearing device or a hearable which includes an audio processing facility 170. The audio processing facility 170 can include audio signal processing circuitry, a speaker or a receiver, and optionally one or more microphones. In accordance with any of the embodiments disclosed herein, the device 100a, 100b, 100c, 100d, 100e, 100f can be implemented as a physiologic (e.g., biometric) monitoring device and include a sensor facility 134. When implemented for physiologic monitoring, the device 100a, 100b, 100c, 100d, 100e, 100f can include or exclude (e.g., be devoid of) the audio processing facility 170. The device 100a, 100b, 100c, 100d, 100e, 100f can also incorporate a communication facility configured to effect communications between two of the devices 100a, 100b, 100c, 100d, 100e, 100f and/or with an external electronic device, system and/or the cloud. The communication facility can include one or both of an RF transceiver/antenna and/or an NFMI transceiver/antenna (see, e.g., device 100f shown in FIG. 10).

According to any of the embodiments disclosed herein, the housing 102 can be configured for deployment at least partially within the outer ear, such as from the helix to the ear canal (e.g., the concha cymba, concha cavum) and can extend up to or into the ear canal. According to any of the embodiments disclosed herein, the housing 102 can be configured for deployment at or on the wearer's outer ear, such as behind the wearer's ear or situated on or over the wearer's ear without extending into the wearer's ear or ear canal.

The housing 102 is configured to contain or support a number of components including charging circuitry 145 coupled to a rechargeable power source 144 (e.g., a lithium-ion battery) and charge contacts 146. A controller 120 is operatively coupled to the charging circuitry 145 and other components of the device 100a, 100b, 100c, 100d, 100e, 100f. The charge contacts 146 typically comprise at least one positive contact and at least one negative or ground contact exposed on an exterior surface of the housing 102. When recharging the rechargeable power source 144, the device 100a, 100b, 100c, 100d, 100e, 100f is typically placed in a charging unit comprising positive and negative charge contacts which electrically couple to corresponding positive and negative charge contacts 146 of the device 100a, 100b, 100c, 100d, 100e, 100f. The charging circuitry 145 of the device 100a, 100b, 100c, 100d, 100e, 100f cooperates with charging circuitry of the charging unit to charge the rechargeable power source 144. The charging circuitry 145 of the device 100a, 100b, 100c, 100d, 100e, 100f can be configured to cooperate with the charging unit in accordance with the representative examples disclosed in commonly owned, co-pending U.S. Published Patent Application No. 2019/0386,498, which is incorporated herein by reference in its entirety.

The device 100a, 100b, 100c, 100d, 100e, 100f includes a user-actuatable control 132 comprising, or coupled to, a touch sensor 138. The touch sensor 138 is coupled to the charge contacts 146. In some embodiments, such as those shown in FIGS. 1 and 2, the touch sensor 138 comprises the charge contacts 146 and circuitry of the user-actuatable control 132 (e.g., analog-to-digital converter, signal processing circuitry; see e.g., FIG. 8). In other embodiments, such as those shown in FIGS. 3, 4, and 7, the touch sensor 138 comprises the charge contacts 146, one or more auxiliary sensors 141 (e.g., a thermistor) operatively coupled to the charge contacts 146, and circuitry of the user-actuatable control 132. In further embodiments, such as that shown in FIG. 5, the touch sensor 138 comprises the charge contacts 146, one or more auxiliary sensors 141 operatively coupled to the controller 120 (but not to the charge contacts 146), and circuitry of the user-actuatable control 132.

The touch sensor 138 can be implemented as a sensor comprising the charge contacts 146 and configured to sense for a change in one or any combination of impedance, conductance, resistance, and electrodermal activity. More particularly, the touch sensor 138 can be implemented as a sensor that uses the charge contacts 146 to sense for a change in one or any combination of impedance, conductance, resistance, and electrodermal activity due to the presence of the wearer's finger 143 at the touch sensor 138 (referred to herein as a touch input). For example, and with reference to FIG. 2, the touch sensor 138a includes first and second charge contacts 147, 148 which are spaced apart from one another on the housing 102. The spacing between charge contacts 147, 148 is preferably wide enough to provide electrical isolation therebetween yet small enough to make contact with an average person's finger 143 when the finger 143 is touching the touch sensor 138a. For example, the charge contacts 147, 148 can have a spacing from about 0.25 mm to about 16 mm, and have any shape (e.g., round, oval, square, rectangular, arbitrary).

Figure 2:
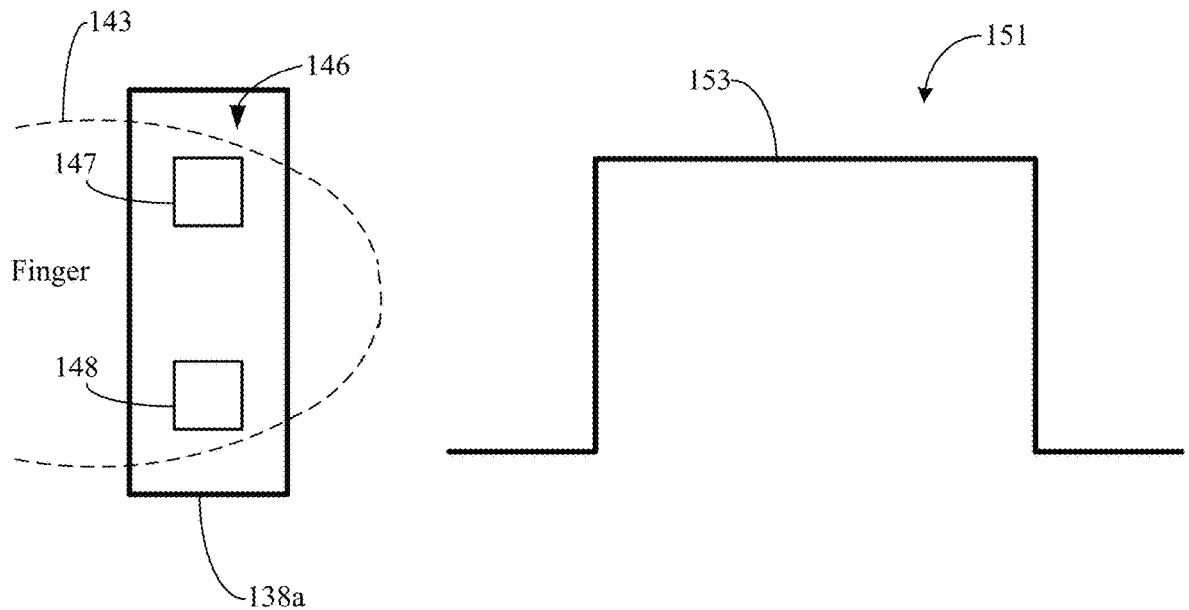
FIG. 2 shows a touch sensor of an ear-worn electronic device and an output signal generated by the touch sensor, the touch sensor comprising first and second charge contacts in accordance with any of the embodiments disclosed herein.

In accordance with any of the embodiments disclosed herein, and as shown in FIG. 2, the touch sensor 138a is configured to sense contact between the wearer's finger 143 and the charge contacts 147, 148 as a touch input. The user-actuatable control 132 generates a touch signal 151 in response to the touch input sensed by the touch sensor 138a. The representative touch signal 151 shown in FIG. 2 is a pulse 153 (e.g., a voltage or current pulse) generated by signal processing circuitry of the user-actuatable control 132. The user-actuatable control 132 communicates the pulse 153 or an output signal corresponding to the pulse 153 to the controller 120. The controller 120 is configured to initiate a device setting, function or operation or a plurality of device functions or operations in response to the touch input pulse 153.

Although a single pulse 153 is shown in the representative example of FIG. 2, it is understood that multiple pulses 153 can be generated by the user-actuatable control 132 and operated on by the controller 120 to perform a number of different operations. Multiple pulses 153 can be generated in response to multiple touches to the touch sensor 138a. The number, duration, and/or time separation of wearer touches to the touch sensor 138a and corresponding pulses 153 can correspond to a number of different device commands.

For example, a single touch to the touch sensor 138a followed by a long pause (e.g., a single tap input) can be interpreted by the controller 120 as corresponding to a volume up command. Two touches to the touch sensor 138a separated in time by a short pause (e.g., a double tap input) can be interpreted by the controller 120 as corresponding to a volume down command. A single long duration touch to the touch sensor 138a can be interpreted by the controller 120 as corresponding to a communication device (e.g., telecoil, RF transceiver) activation command. Two long duration touches to the touch sensor 138a can be interpreted by the controller 120 as corresponding to a communication device deactivation command. It is understood that an ear-worn electronic device 100a, 100b, 100c, 100d, 100e, 100f can include two or more touch sensors 138a, and that not all touch sensors 138a need to be coupled to the charge contacts 146. For example, a first touch sensor 138a can be coupled to the charge contacts 146, and a second touch sensor 138a can be coupled to the controller 120 and not the charge contacts 146. The second touch sensor 138a can be located on the housing 102 near to, or spaced apart from, the first touch sensor 138a.

Multiple commands for a given device setting, function or operation can also be input to the device 100a, 100b, 100c, 100d, 100e, 100f via the touch sensor 138a. For example, a short duration touch followed by a long duration touch applied to the touch sensor 138a can initiate a hearing aid memory selection routine. Once initiated, application of individual short duration touches to the touch sensor 138a can allow the wearer to step/cycle through a number of different hearing aid memories, each of which activates different hearing aid settings (e.g., speech enhancement settings, noise reduction settings, ambient environment classification settings).

Examples

The following non-limiting examples are representative capabilities that can be implemented by the device 100a, 100b, 100c, 100d, 100e, 100f via the touch sensor 138a according to any of the embodiments disclosed herein. The touch sensor 138a (e.g., user-actuatable control) can be configured to effect cycling through device settings in response to wearer inputs to the touch sensor 138a. For example, the wearer input can be a single tap or a series of single taps to the touch sensor 138a. The wearer input can be a double tap or a series of double taps to the touch sensor 138a. The wearer input can be a multiple tap (e.g., 3, 4, of 5 taps) or a series of multiple taps to the touch sensor 138a.

The touch sensor 138a can be configured, in response to sensing a double tap or a multiple tap, to one or both of enable and disable one or more device settings or device functions. The one or more device settings or device functions can include one or more of active noise cancelation, a BLE pairing mode, an automatic vent facility, and output of an audio message, an audio signal, electromagnetic signal or optical signal.

The touch sensor 138a can be configured, in response to sensing a first press having a first duration longer than a duration of a tap, to activate one or more of (a) a device setting or a plurality of device setting settings and (b) a device function or a plurality of device functions. The touch sensor 138a can be configured, in response to sensing a second press having a second duration longer than the first duration, to activate one or more of (a) a device setting or a plurality of device setting settings and (b) a device function or a plurality of device functions. Example The first duration can be longer than about 1 second. For example, the first duration can be about 1.5 seconds. The second duration can be longer than about 2.5 seconds, such as longer than about 3 seconds or a duration of about 3 to 4 seconds. The touch sensor 138a can be configured, in response to sensing the first press, to activate one or more of (a) a device setting or a plurality of device setting settings and (b) a device function or a plurality of device functions. The touch sensor 138a can be configured, in response to sensing the second press, to turn the device on and/or off.

According to another example, the touch sensor 138a can be configured, in response to sensing a multiple tap, to open a menu (e.g., an audio menu via the ear-worn electronic device or a visual menu via an external device such as a smartphone) of one or both of device settings and function options for a predetermined period of time or for as long as wearer taps are occurring. The touch sensor 138a can be configured to effect cycling through one or both of the device settings and the function options in response to sensing single taps, for example.

In accordance with a further example, a system comprises a first device 100a, 100b, 100c, 100d, 100e, 100f and a second device 100a, 100b, 100c, 100d, 100e, 100f. The first and second ear-worn electronic devices 100a, 100b, 100c, 100d, 100e, 100f each comprises the touch sensor 138a. The touch sensor 138a of the first device 100a, 100b, 100c, 100d, 100e, 100f has the same wearer input response functionality as the touch sensor 138a of the second device 100a, 100b, 100c, 100d, 100e, 100f. In another example, the touch sensor 138a of the first device 100a, 100b, 100c, 100d, 100e, 100f has a different wearer input response functionality as the touch sensor 138a of the second device 100a, 100b, 100c, 100d, 100e, 100f.

It is understood that these and other examples of hearing device functions described herein represent non-exhaustive, non-limiting examples of device commands that can be initiated by a wearer using a user-actuatable control facility disclosed herein.

Figure 3:
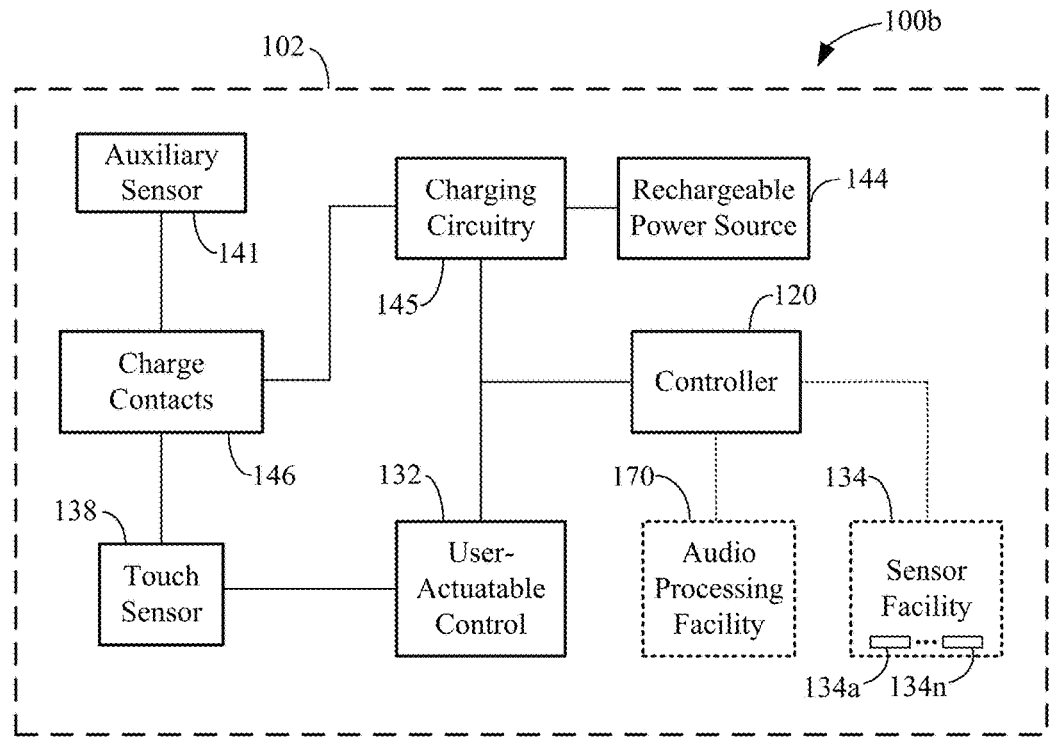
FIG. 3 is a block diagram of an ear-worn electronic device which includes a user-actuatable control comprising a touch sensor in accordance with any of the embodiments disclosed herein.

The device 100b shown in FIG. 3 is a variation of the device 100a shown in FIG. 1 in accordance with any of the embodiments disclosed herein. In addition to the components and functionality described with reference to FIG. 1, the device 100b shown in FIG. 2 includes an auxiliary sensor 141 coupled to the charge contacts 146. Although a single auxiliary sensor 141 is shown in FIG. 3, it is understood that more than one auxiliary sensor 141 can be coupled to charge contacts 146. In the embodiment shown in FIG. 3, the touch sensor 138 comprises the charge contacts 146, one or more auxiliary sensors 141 operatively coupled to the charge contacts 146, and circuitry of the user-actuatable control 132. The addition of an auxiliary sensor 141 to the touch sensor 138 adds robustness to the touch detection circuitry and reduces or eliminates false detections (e.g., a false positive or a false negative).

Figure 4:
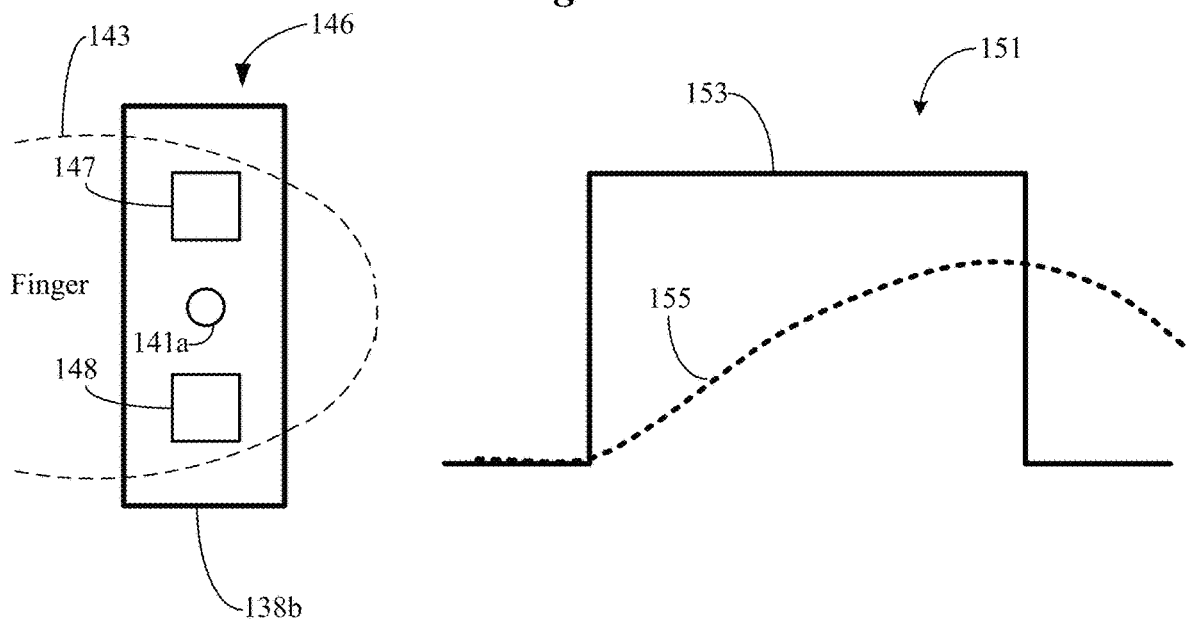
FIG. 4 shows a touch sensor of an ear-worn electronic device and an output signal generated by the touch sensor, the touch sensor comprising first and second charge contacts and an auxiliary sensor in accordance with any of the embodiments disclosed herein.

As is best seen in FIG. 4, the touch sensor 138b comprises first and second charge contacts 147, 148, an auxiliary sensor 141 (e.g., a thermistor 141a) operatively coupled to the charge contacts 147, 148, and circuitry of the user-actuatable control 132. The touch sensor 138b is configured to sense for a change in one or any combination of impedance, conductance, resistance, and electrodermal activity. Additionally, the auxiliary sensor 141 of the touch sensor 138b is configured to sense presence of the wearer's finger at the touch sensor 138b in a manner that differs from that of the charge contacts 147, 148. By way of example, the auxiliary sensor 141 can comprise a temperature sensor, such as a thermistor 141a. It is understood that the auxiliary sensor 141 can be a sensor other than a temperature sensor, representative examples of which are disclosed herein.

A suitable thermistor 141a is a glass encapsulated thermistor, which includes a chip (e.g., a negative temperature coefficient (NTC) chip) encapsulated within a bead of glass. Leads (e.g., dumet leads) are coupled to the chip and to circuitry (e.g., signal processing circuitry) within or coupled to the temperature sensor 141a. A suitable thermistor 141a is a surface mount device (SMD) thermistor. Other temperature sensors can be used in the auxiliary sensor 141, including thermocouples, bimetallic temperature sensors, resistance temperature detectors (RTDs), semiconductor-based temperature sensors, digital thermistors, and other types of resistance temperature sensors. For example, passive thermistors as small as 1.6 mm×0.8 mm×0.8 mm that only require one additional resistor can be used, which are particularly useful for incorporation in an ear-worn device 100b.

Advantageously, the thermistor 141a or other type of temperature sensing device of the touch sensor 138b need not provide an absolute temperature measurement, such as body core temperature. Rather, a relative temperature measurement can be used to detect presence of the wearer's finger at the touch sensor 138a. Accordingly, relatively low-cost, reduced-precision temperature sensors (e.g., thermistors 141a) can be incorporated as the auxiliary sensor 141 of the ear-worn electronic device 100b. Use of relatively low-cost, reduced-precision temperature sensors advantageously reduces the cost and complexity of an ear-worn electronic device which includes a user-actuatable control comprising a touch sensor in accordance with any of the embodiments disclosed herein.

In an ear-worn device 100b that incorporates a thermistor 141a, the leads or contacts of the thermistor 141a are coupled to an analog-to-digital converter (ADC) and signal processing logic or a processor (e.g., signal processing circuitry) integral or coupled to the auxiliary sensor 141. Changes in thermistor resistance correspond to changes in temperature. Thermistor resistance can be converted to temperature by the processor using the well-known Steinhart-Hart equation (e.g., via a lookup table). The Steinhart-Hart equation is considered the best mathematical expression for the resistance-temperature relationship of NTC thermistors. The coefficients of the Steinhart-Hart equation vary with thermistor type and are typically provided by the manufacturer or readily derivable. A thermistor or other temperature sensor 141a can be mounted on, to or supported by the housing 102 at the touch sensor 138b, such as between the first and second contacts 147, 148.

For example, the thermistor 141a can be mounted on a surface of the housing 102 that supports the touch sensor 138a and covered with a protective, thermally conductive outer layer. The thermistor 141a can be mounted within a wall of the housing 102 or within the interior of the housing 102. In such implementations, the thermistor 141a can be covered and/or surrounded with thermally conductive material to provide thermal coupling between the thermistor 141a and the thermal environment at or outside of the portion of the housing 102 that supports the touch sensor 138a. Representative examples of various thermistors 141a, mounting configurations, and signal processing techniques are disclosed in commonly owned, co-pending U.S. Published Patent Application No. 2019/0117155, which is incorporated herein by reference.

In accordance with any of the embodiments disclosed herein, and as shown in FIG. 4, the touch sensor 138b is configured to sense contact between the wearer's finger 143 and the charge contacts 147, 148 and, in addition, sense a temperature change due to the presence of the wearer's finger 143 in proximity to the thermistor 141a as a touch input. The user-actuatable control 132 generates a touch signal 151 in response to the touch input sensed by the touch sensor 138b. The representative touch signal 151 shown in FIG. 4 includes a first component indicative of touch detection by the charge contacts 146 and a second component indicative of touch detection by the thermistor 141a. The first component is a pulse 153 (e.g., a voltage or current pulse) generated by signal processing circuitry of the user-actuatable control 132. The second component is a thermal pulse 155 generated by signal processing circuitry of the user-actuatable control 132 in response to an output signal generated by the thermistor 141a. Typically, the pulse 153 is a digital waveform which approximates a square wave. The thermal pulse 155 is typically a waveform that rises and falls slower than the digital pulse 153. However, the magnitude of the thermal pulse 155 changes sufficiently fast during the duration of the digital pulse 153 such that it can be readily detected as being present or absent.

The user-actuatable control 132 communicates the pulses 153, 155 or output signals corresponding to the pulses 153, 155 to the controller 120. The controller 120 is configured to initiate a device setting, function or operation or a plurality of device settings, functions or operations in response to detecting presence of both pulses 153, 155. In the case of the controller 120 detecting the presence of only one of the two pulses 153, 155, the controller 120 does not initiate a device setting, function or operation. In this case, the controller 120 may take a corrective action such as storing touch sensor data for the anomalous touch detection event and/or generating an alert perceivable by the wearer indicative of the anomalous touch detection event (e.g., a tactile or audible alert).

Although a single touch event (e.g., single pulse 153, single pulse 155) is shown in the representative example of FIG. 4, it is understood that multiple pulses 153, 155 can be generated by the user-actuatable control 132 and operated on by the controller 120 to perform a number of different functions or operations. Multiple pulses 153, 155 can be generated in response to multiple touches to the touch sensor 138b. The number, duration, and/or time separation of wearer touches to the touch sensor 138b and corresponding pulses 153, 155 can correspond to a number of different device commands, representative examples of which are described herein.

Figure 5:
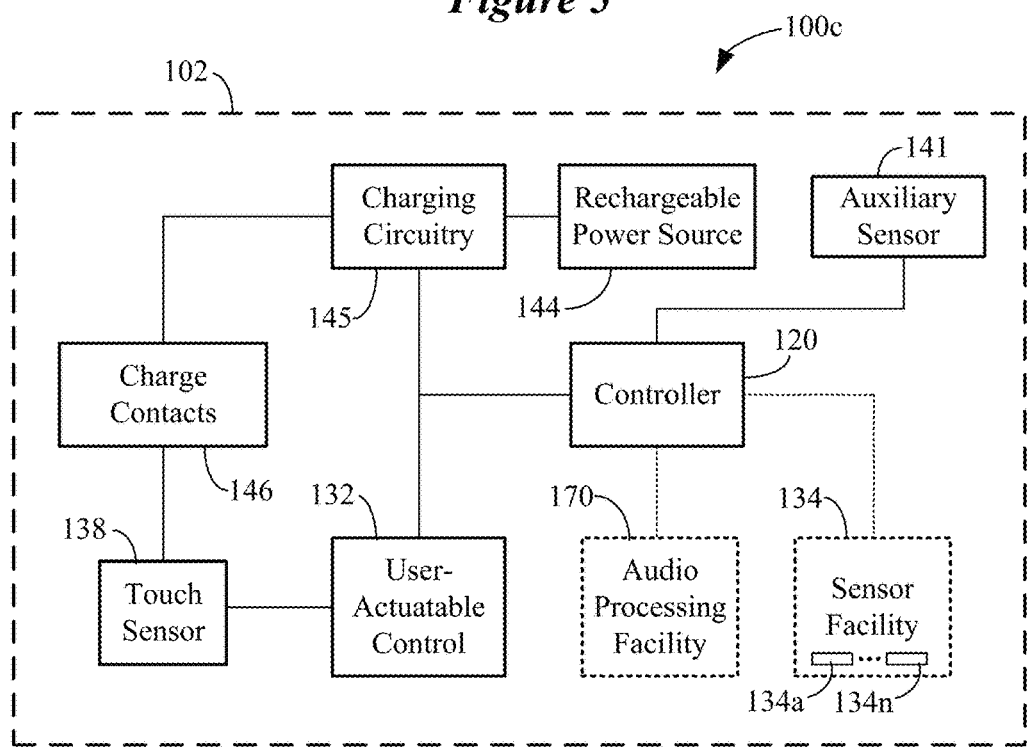
FIG. 5 is a block diagram of an ear-worn electronic device which includes a user-actuatable control comprising a touch sensor in accordance with any of the embodiments disclosed herein.

The device 100c shown in FIG. 5 is a variation of the device 100b shown in FIG. 3 in accordance with any of the embodiments disclosed herein. In addition to the components and functionality described with reference to FIG. 3, the device 100c shown in FIG. 5 includes the auxiliary sensor 141 coupled to the controller 120 rather than the charge contacts 146. Although a single auxiliary sensor 141 is shown in FIG. 5, it is understood that more than one auxiliary sensor 141 can be coupled to the controller 120. In the embodiment shown in FIG. 5, the touch sensor 138 comprises the charge contacts 146, an auxiliary sensor 141 operatively coupled to the controller 120, and circuitry of the user-actuatable control 132. The auxiliary sensor 141 can be any type of sensor disclosed herein, including a temperature sensor (e.g., thermistor), a motion sensor, an electrical sensor (e.g., impedance, conductance, resistance sensor), an electrodermal activity sensor, and/or a physiologic sensor.

In accordance with any of the embodiments disclosed herein, and with continued reference to FIG. 4, the touch sensor 138 of the device 100c shown in FIG. 5 is configured to sense contact between the wearer's finger 143 and the charge contacts 147, 148 and, in addition, sense a parameter change due to the presence of the wearer's finger 143 in proximity to the auxiliary sensor 141 as a touch input. The user-actuatable control 132 generates a touch signal 151 in response to the touch input sensed by the touch sensor 138b. The touch sensor 138 of the device 100c shown in FIG. 5 is configured to generate multiple pulses 153, 155 responsive to a touch event in a manner similar to that shown in FIG. 4. It is understood, however, that the characteristics of the auxiliary sensor signal 155 will vary depending on the type of auxiliary sensor 141 used. For example, in the case of the auxiliary sensor 141 comprising an IMU, the auxiliary sensor signal 155 will be much more responsive (faster) than the thermistor output signal depicted in FIG. 4. For simplicity, auxiliary sensor signal 155 will be described as a pulse in the following discussion.

The user-actuatable control 132 communicates the pulses 153, 155 or output signals corresponding to the pulses 153, 155 to the controller 120. The controller 120 is configured to initiate a device setting, function or operation or a plurality of device settings, functions or operations in response to detecting presence of both pulses 153, 155. In the case of the controller 120 detecting the presence of only one of the two pulses 153, 155, the controller 120 does not initiate a device operation. In this case, the controller 120 may take a corrective action such as those previously described.

Although a single touch event (e.g., single pulse 153, single pulse 155) is shown in the representative example of FIG. 4 in the context of the device 100*c* shown in FIG. 5, it is understood that multiple pulses 153, 155 can be generated by the user-actuatable control 132 and operated on by the controller 120 to perform a number of different functions or operations. Multiple pulses 153, 155 can be generated in response to multiple touches to the touch sensor 138*b*. The number, duration, and/or time separation of wearer touches to the touch sensor 138*b* and corresponding pulses 153, 155 can correspond to a number of different device functions or commands, representative examples of which are described herein.

Figure 6:
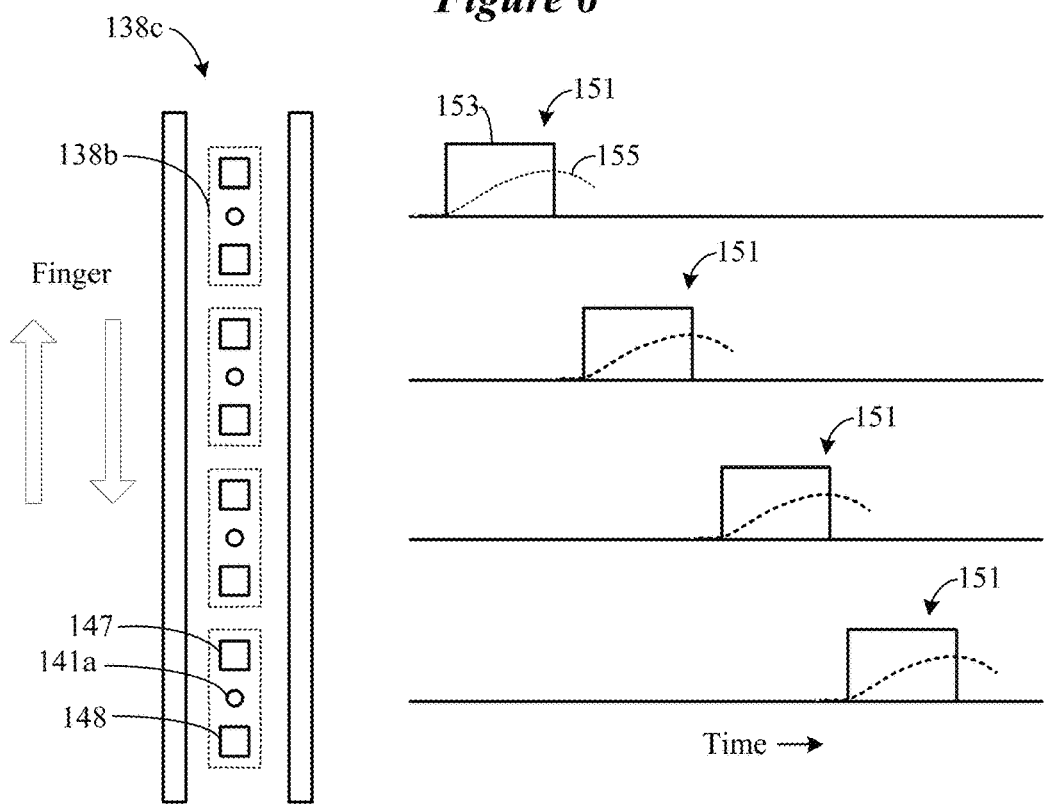
FIG. 6 shows a touch sensor of an ear-worn electronic device and an output signal generated by the touch sensor, the touch sensor comprising first and second charge contacts and an auxiliary sensor in accordance with any of the embodiments disclosed herein.

FIG. 6 illustrates a touch sensor 138*c* of an ear-worn electronic device 100*a*, 100*b*, 100*c*, 100*d*, 100*e*, 100*f* in accordance with any of the embodiments disclosed herein. The touch sensor 138*c* comprises a multiplicity of touch sensor elements (e.g., 138*a* and/or 138*b*). The touch sensor 138*c* can be described as a swipe sensor comprising a multiplicity of touch sensor elements (e.g., touch sensors 138*b*) which can be activated sequentially or individually by the wearer's finger. Each of the touch sensor elements 138*b* can correspond to the touch sensor 138*b* shown in FIG. 4. It is understood that the touch sensor elements 138*b* can be the same or different in terms of construction, responsiveness, and/or functionality.

One, some or all of the touch sensor elements 138*b* can be coupled to charge contacts 146 of an ear-worn electronic device 100*a*, 100*b*, 100*c*, 100*d*, 100*e*, 100*f*. In some configurations, the touch sensor 138*c* can be situated on the housing 102 spaced from the charge contacts 146, such as on an exterior surface location that typically supports a conventional pushbutton/rocker switch. A separate touch sensor, such as touch sensor 138*b* shown in FIG. 4, can be coupled to the charge contacts 146 and be operated cooperatively with the touch sensor 138*c* to control the device 100*a*, 100*b*, 100*c*, 100*d*, 100*e*, 100*f* in manners described herein. In such configurations, the touch sensor 138*c* can be a printed sensor using conductive inks or a laser direct structure (LDS) applied on a plastic housing 102 of the device 100*a*, 100*b*, 100*c*, 100*d*, 100*e*, 100*f*. The printed or LDS touch sensor 138*c* can have an artistic design.

Each of the touch sensor elements 138*b* comprises first and second contacts 147, 148 and an auxiliary sensor 141*a* (e.g., a thermistor). The first and second contacts 147, 148 of at least one of the touch sensor elements 138*b* are coupled to charging contacts 146 of the device 100*a*, 100*b*, 100*c*, 100*d*, 100*e*, 100*f*. The auxiliary sensor 141*a* of the at least one touch sensor element 138*b* can also be, but need not be, coupled to the charging contacts 146. The first and second contacts 147, 148 of each touch sensor element 138*b* are configured to sense for a change in one or any combination of impedance, conductance, resistance, and electrodermal activity as previously described. Additionally, the auxiliary sensor 141*a* of each touch sensor element 138*b* is configured to sense presence of the wearer's finger at the touch sensor element 138*b* in a manner that differs from that of the charge contacts 147, 148. By way of example, the auxiliary sensor 141*a* can comprise a temperature sensor, such as a thermistor 141*a*, or other type of auxiliary sensor disclosed herein.

In response to a swipe input to the touch sensor 138*c* by the wearer, and as shown in FIG. 6, the user-actuatable control 132 generates a series of touch signals 151 which are communicated to, and interpreted by, the controller 120. The touch sensor 138*c* is configured to generate multiple pulses or waveforms 153, 155 separated in time in response to a swiping touch input by the wearer. Fast swipes, slow swipes, or combinations of fast and slow swiping actions can correspond to different wearer input commands which are interpreted and implemented by the controller 120. It is understood, however, that the characteristics of the auxiliary sensor signal 155 will vary depending on the type of auxiliary sensor used as previously discussed. For simplicity, auxiliary sensor signals 155 will be described as a pulse in the following discussion.

The user-actuatable control 132 communicates the time-separated series of touch signals 151 to the controller 120. The controller 120 is configured to initiate a device setting, function or operation or a plurality of device settings, functions or operations in response to detecting the presence, speed (e.g., time differences), and/or swipe direction (sensor element activation sequence) of the sequence of touch signals 151. The controller 120 can detect the presence or absence of each of the pulses 153, 155 generated by each of the touch sensor elements 138*b* and, if appropriate, take a corrective action as previously described.

As was previously discussed, and in accordance with any of the embodiments disclosed herein, the device 100*a*, 100*b*, 100*c*, 100*d*, 100*e*, 100*f* can be configured as a hearing device or a hearable which includes an audio processing facility 170. The audio processing facility 170 includes audio signal processing circuitry coupled to a speaker or receiver and optionally to one or more microphones. According to embodiments that incorporate the audio processing facility 170, the device 100*a*, 100*b*, 100*c*, 100*d*, 100*e*, 100*f* can be implemented as a hearing assistance device that can aid a person with impaired hearing. For example, the device 100*a*, 100*b*, 100*c*, 100*d*, 100*e*, 100*f* can be implemented as a monaural hearing aid or a pair of devices 100*a*, 100*b*, 100*c*, 100*d*, 100*e*, 100*f* can be implemented as a binaural hearing aid system. By way of further example, the device 100*a*, 100*b*, 100*c*, 100*d*, 100*e*, 100*f* can be implemented as a monaural or binaural personal sound amplification device, such as a consumer earbud.

As was also previously discussed, and in accordance with any of the embodiments disclosed herein, the device 100*a*, 100*b*, 100*c*, 100*d*, 100*e*, 100*f* can include a sensor facility 134 in addition to, or exclusive of, and audio processing facility 170. For example, device 100*a*, 100*b*, 100*c*, 100*d*, 100*e*, 100*f* can be configured as a physiologic (e.g., biometric) monitoring device which includes or excludes an audio processing facility 170. The sensor facility 134 can include one or more sensors 134*a*-134*n*. The sensor facility 134 can also include signal processing circuitry configured to process signals produced by the one or more sensors 134*a*-134*n*. The sensor facility 134 can include one or more temperature sensors 134*a* (e.g., thermistors), one or more motion sensors 134*b*, one or more optical sensors 134*c*, and/or one or more electrical sensors 134*d*. The one or more motion sensors 134*b* can include one or more of accelerometers, gyros, and magnetometers. For example, the motion sensor 134b can be implemented to include a multi-axis (e.g., 9-axis) sensor, such as an IMU. A suitable IMU is disclosed in commonly owned U.S. Pat. No. 9,848,273, which is incorporated herein by reference. The one or more optical sensors 134c can include a photoplethysmography (PPG) sensor, such as a pulse oximeter. The one or more electrical sensors 134d can include one or more sensors configured to contact the skin of the wearer's ear and sense a change in an electrical property of the skin. For example, the one or more electrical sensors 134d can be configured to sense one or any combination of impedance, conductance, resistance, and electrodermal activity (e.g., galvanic skin response).

The sensor facility 134 of the device 100a, 100b, 100c, 100d, 100e, 100f can include one or more physiologic or biometric sensors 134e. The physiologic/biometric sensors 134e can include one or more of an EKG or ECG sensor, an $SpO_2$ sensor, a blood pressure sensor, a respiration sensor, a glucose sensor, an EEG sensor, an EMG sensor, and an EOG sensor.

Representative examples of such sensors are disclosed in US Pat. Pub. Nos. 2018/0014784 (Heeger et al.), 2013/0216434 (Ow-Wing), and 2010/0253505 (Chou), and in U.S. Pat. No. 9,445,768 (Alexander et al.) and U.S. Pat. No. 9,107,586 (Bao), each of which is incorporated herein by reference in its entirety.

According to some implementations, a sensor of the sensor facility 134 can be used as a "wake up" sensor (e.g., activation sensor) for the touch sensing circuitry of the device 100a, 100b, 100c, 100d, 100e, 100f. For example, a motion sensor 134b (e.g., an IMU) can generate a wake up signal (e.g., activation signal) in response to detecting a double tap on the housing 102 generated by the wearer's finger. In response to a touch input to the touch sensor 138 which corresponds to a device command, the controller implements a device setting, function or operation corresponding to the device command (e.g., an incremental volume or memory change).

For example, one touch applied to the touch sensor 138 can correspond to one incremental step up in volume or memory until the top setting is reached and then another touch would drop the setting to its lowest level. The cycle could then be input again. In addition to memory and or volume control, a longer duration touch (or a press & hold) applied to the touch sensor 138 can place or remove the device 100a, 100b, 100c, 100d, 100e, 100f from a low power state that the wearer would interpret as functional on or off. This functionality solves the issue common to most buttonless devices of how to shut the device down when a phone, remote, or charging base is not present.

Figure 7:
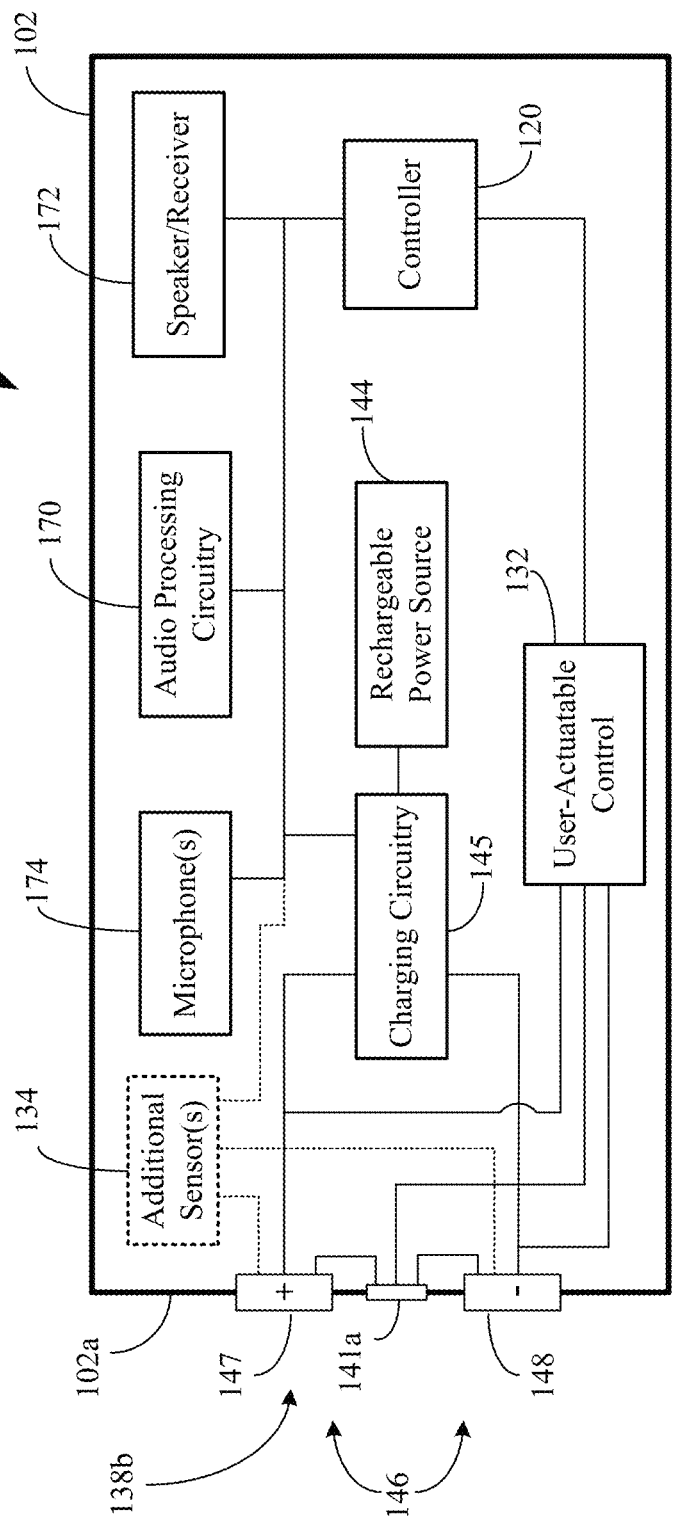
FIG. 7 is a block diagram of an ear-worn electronic device which includes a user-actuatable control comprising a touch sensor in accordance with any of the embodiments disclosed herein.

FIG. 7 illustrates an ear-worn electronic device 100d incorporating a user-actuatable control comprising a touch sensor in accordance with any of the embodiments disclosed herein. The device 100d is configured as a hearing device, such as any of those discussed herein (e.g., an earbud, hearable, personal sound amplification device, hearing aid). The ear-worn electronic device 100d shown in FIG. 7 includes a housing 102 configured for deployment in, on or about an ear of a wearer as previously described. For example, the housing 102 can be configured for deployment at least partially within the wearer's ear. By way of further example, the housing 102 can be configured for deployment at least partially or entirely within an ear canal of the wearer's ear. In another representative configuration, the housing 102 can be configured for deployment at or on the wearer's outer ear, such as behind the wearer's ear or situated on or over the wearer's ear without extending into the wearer's ear or ear canal.

The device 100d includes an audio processing facility 170 coupled to a speaker or receiver 172 and one or more microphones 174. The audio processing facility 170 can include audio signal processing circuitry (e.g., analog front-end, analog-to-digital converters, digital-to-analog converters, DSP, various analog and digital filters). The one or more microphones 174 can include one or more discrete microphones or a microphone array(s) (e.g., configured for microphone array beamforming). A multiplicity of microphones 174 can be situated at different locations of the housing 102.

The housing 102 is configured to contain or support a number of other components including charging circuitry 145 coupled to a rechargeable power source 144 (e.g., a lithium-ion battery) and charge contacts 146. A controller 120 is operatively coupled to the charging circuitry 145, audio processing circuitry 170, and a user-actuatable control 132, among other components of the device 100d. The charge contacts 146 typically comprise at least one positive contact 147 and at least one negative or ground contact 148 exposed on an exterior surface 102a of the housing 102. The charge contacts 146 are configured to electrically couple to corresponding charge contacts of an external charging unit as previously described.

The user-actuatable control 132 comprises, incorporates, or is coupled to a touch sensor 138b, which is representative of the touch sensor 138b shown in FIG. 4. Other touch sensor configurations can be incorporated in the user-actuatable control 132, such as the touch sensor 138c shown in FIG. 6. The touch sensor 138b shown in FIG. 7 includes an auxiliary sensor 141 in the form of a thermistor 141a or other type of temperature sensor coupled to the charge contacts 146. In the embodiment shown in FIG. 7, the touch sensor 138b includes the charge contacts 146 (positive and negative contacts 147, 148), the thermistor 141a, and circuitry of the user-actuatable control 132. The touch sensor 138b shown in FIG. 7 is configured to sense for a change in impedance using charge contacts 147, 148 and for a change in temperature using thermistor 141a in response to contact between the touch sensor 138b and a wearer's finger. The user-actuatable control 132 can incorporate the circuitry shown in FIG. 8.

As was previously discussed, the user-actuatable control 132 can be configured to detect single and multiple touch inputs for implementing a number of different functions or operations by the controller 120, including memory settings, audio output settings, microphone settings, etc. In addition to these and other functions described herein, the user-actuatable control 132 can be configured to receive an input from the wearer of the device 100d to change speech enhancement parameters of the device 100d, such as enabling/disabling of speech enhancement, fixed or adaptable cutoff frequency, etc. Other parameters, such as upper and lower bounds the adaptable cutoff frequency may be set by a user or technician via the user-actuatable control 132, e.g., to adapt performance to suit the level of hearing impairment of the user of the device. A speech enhancement module of the device 100d can be implemented in software, hardware, or a combination of hardware and software. The speech enhancement module can be a component of, or integral to, the processor 120 or another processor (e.g., a DSP) coupled to the processor 120. The speech enhancement module can be configured to detect speech in different types of acoustic environments. The different types of sound can include speech, music, and several different types of noise (e.g., wind, transportation noise and vehicles, machinery), etc., and combinations of these and other sounds (e.g., transportation noise with speech).

Figure 10:
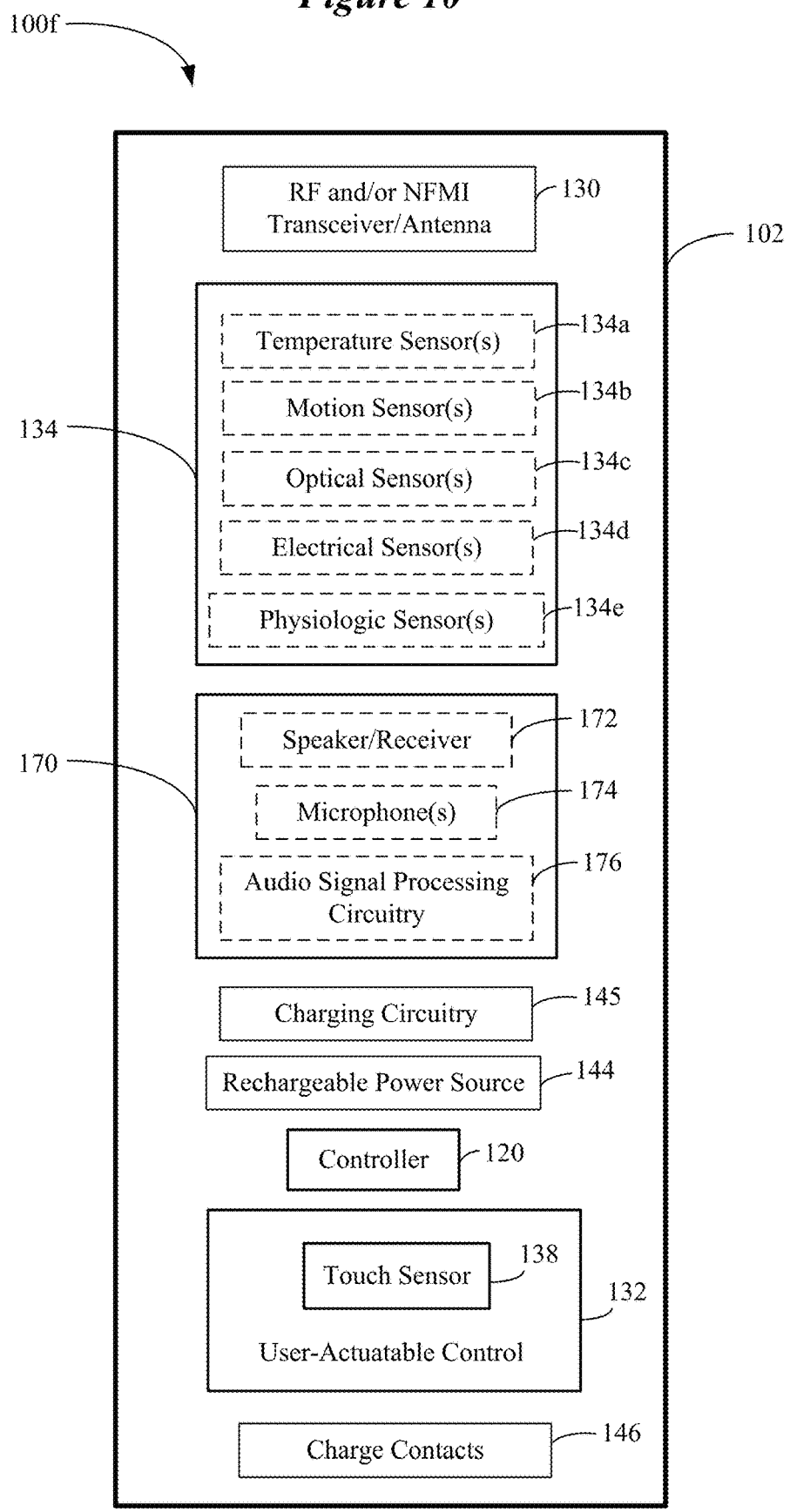
FIG. 10 is a block diagram of an ear-worn electronic device which includes a user-actuatable control comprising a touch sensor in of accordance with any of the embodiments disclosed herein.

The device 100d (and other devices 100a, 100b, 100c, 100e, 100f) can include one or more communication devices coupled to one or more antenna arrangements (see, e.g., FIG. 10). For example, one or more communication devices can include one or more radios that conform to an IEEE 802.11 (e.g., WiFi®) or Bluetooth® (e.g., BLE, Bluetooth® 4. 2, 5.0, 5.1, 5.2 or later) specification, for example. In addition, or alternatively, the device 100d (and other devices 100a, 100b, 100c, 100e, 100f) can include a near-field magnetic induction (NFMI) sensor (e.g., an NFMI transceiver coupled to a magnetic antenna) for effecting short-range communications (e.g., ear-to-ear communications, ear-to-kiosk communications).

Figure 8:
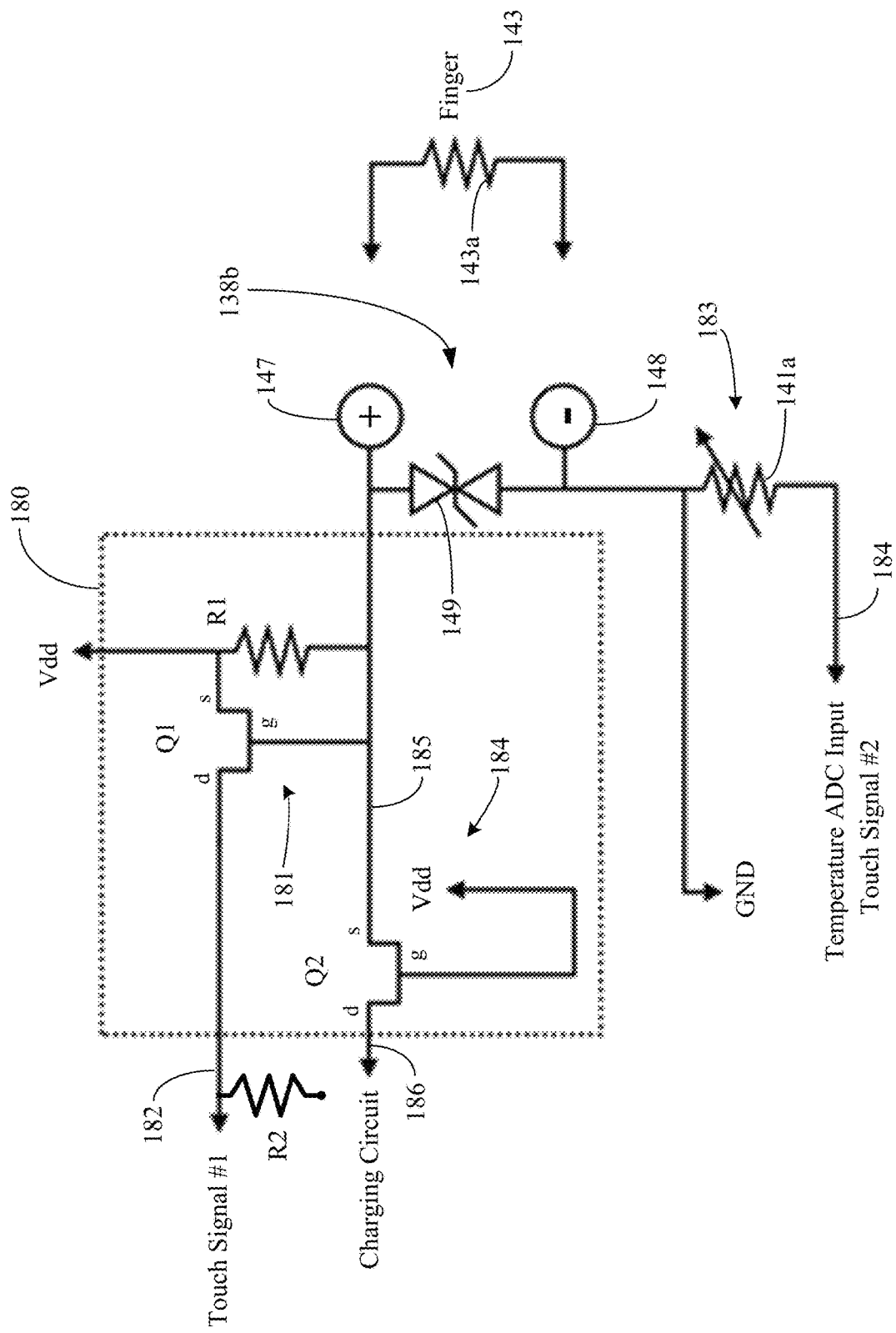
FIG. 8 illustrates a touch detection circuit integral or coupled to a user-actuatable control of an ear-worn electronic device in accordance with any of the embodiments disclosed herein.

FIG. 8 illustrates a touch detection circuit 180 integral or coupled to a user-actuatable control of an ear-worn electronic device 100a, 100b, 100c, 100d, 100e, 100f in accordance with any of the embodiments disclosed herein. The touch detection circuit 180 can be implemented as an ASIC, such as a 4-pin ASIC. The components used to construct the touch detection circuit 180 are widely available and very cheap, and the circuit 180 can be less expensive than a single mechanical switch.

The touch detection circuit 180 is electrically coupled to positive and negative charge contacts 147, 148 of a touch sensor 138b. The touch detection circuit 180 includes a first section 181 configured to electrically sense contact between a wearer's finger 143 and the positive and negative contacts 147, 148 of the touch sensor 138b. The first section 181 includes a first field effect transistor (FET) Q1, such as a PMOS FET, with a gate, g, coupled to a charging circuit line 185 connected to positive contact 147. A source, s, of Q1 is coupled to a voltage source having a voltage of Vdd (a lithium-ion battery voltage). A drain, d, of Q1 is coupled to an output 182 over which a Touch Signal #1 can be communicated to the user-actuatable control 132 and/or controller 120 of the device 100a, 100b, 100c, 100d, 100e, 100f. The first section 181 also includes a resistor R1 having a relatively high resistance, such as 10 MΩ, coupled between the charging circuit line 185 and the source voltage Vdd line. It is noted that a pulldown resistor R2 is typically connected to the output 182 for sensing Touch Signal #1, but the resistor R2 need not be part of the touch detection circuit 180.

A second section 183 of the touch detection circuit 180 includes a thermistor 141a coupled to the negative or ground contact 148. The thermistor 141a is configured to thermally sense contact or near-contact between a wearer's finger 143 and the touch sensor 138b. A third section 184 of the touch detection circuit 180 includes a second field effect transistor (FET) Q2, such as a PMOS FET, with a gate, g, coupled to voltage source Vdd, a source, s, coupled to the charging circuit line 185, and a drain, d, coupled to a charging circuit (e.g., a power management IC of charging circuitry 145) of the device 100a, 100b, 100c, 100d, 100e, 100f.

An ESD (electrostatic discharge) or TVS (transient voltage suppression) diode 149 can be connected between the positive and negative charge contacts 147, 148 to prevent damage to, or unintentional activation of, the circuit 180 in response to static discharge from a user's finger 143. The ESD/TVS diode 149 preferably has a very low leakage current to avoid artificially pulling the gate of Q1 low.

When a wearer touches the contact sensor 138b, the wearer's finger acts as a high impedance (e.g., about 10 kΩ to 1 MΩ) applied across the charge contacts 147, 148. The application of this high impedance across the charge contacts 147, 148 pulls the gate, g, of Q1 low, thereby turning on Q1. Charge contact 147 is pulled up to the source voltage Vdd. Turning on Q1 results in a voltage signal equal to Vdd to be communicated to the output 182 as Touch Signal #1.

The second FET, Q2, is configured to prevent a touch event at the electrical contacts 147, 148 from being incorrectly interpreted as a charging event. A charging event can be initiated in response to application of a charging voltage across charge contacts 147, 148 that exceeds the source voltage, Vdd, by at least the threshold voltage, $Vgs_{th}$, of Q2. For example, the charging voltage (e.g., ~5 V) that turns on Q2 for charging is greater than Vdd (e.g., 4.0 V)+$Vgs_{th}$ (e.g., 0.5 V). In other words, the source voltage, Vdd, must be less than the charge voltage, Vchg, minus the threshold voltage, $Vgs_{th}$, of Q2 (e.g., Vdd<Vchg−$Vgs_{th}$).

The thermistor 141a is coupled to the negative charge contact 148, which is the low thermal impedance output side of the circuit 180. When the wearer's finger 143 makes contact or near-contact with the touch sensor 138b, the thermistor 141a immediately changes in temperature and quickly approaches the temperature of the user's finger 143. This rapid change in temperature results in a corresponding change in an analog signal which is communicated from an output 184 of the thermistor 141a (corresponding to Touch Signal #2) to a temperature ADC input of the user-actuatable control 132 and/or controller 120 of the device 100a, 100b, 100c, 100d, 100e, 100f. The controller 120 uses Touch Signal #1 (electrical touch signal) and Touch Signal #2 (thermal touch signal) in a manner previously described for implementing any of the touch detection techniques disclosed herein. It is noted that, unlike capacitive touch solutions, water and hair will not affect the thermistor 141a (or other temperature sensor) in the same way the finger will.

As was discussed previously, the additional input from an auxiliary sensor 141 can reduce or eliminate a false reading when changing temperatures rapidly for example, walking through a doorway with a large temperature gradient. To combat false positives and make the touch sensor 138 more robust, an IMU 134b or a capacitive touch sensor 134d can be used as an auxiliary sensor 141. In the case of the IMU 134b, a double tap could be required to activate the components of the touch sensor 138 (e.g., thermistor 141a or other temperature touch sensor). In the case of a capacitive touch sensor 134d, for example, the touch would only be recognized if both the capacitance changed as well as the temperature. In some configurations, the charge contacts 146 can be used as electrodes coupled to typical skin on/off circuits or to measure the galvanic skin resistance of the wearer's finger if it can be assured that the touch is applied between the charge contacts 146.

It is noted that the thermal path to heat generating components within the device 100a, 100b, 100c, 100d, 100e, 100f to the thermistor 141a or other temperature sensor should be minimized. This can be achieved by using thin copper traces on the flex circuit board, removing solid copper ground and power planes, placing thermal resistive materials between the temperature sensor and hot components such as the rechargeable power source 144.

In accordance with any of the embodiments disclosed herein, the temperature sensor (e.g., thermistor 141a) of the device 100a, 100b, 100c, 100d, 100e, 100f can be used as a forehead thermometer. The wearer can place the device 100a, 100b, 100c, 100d, 100e, 100f in a thermometer mode (via a corresponding touch input) and place the charge contacts 146 on the forehead and wait a few seconds (~10 s). The device 100a, 100b, 100c, 100d, 100e, 100f can report the wearer's temperature. The reporting can be transmitted wirelessly from the device 100a, 100b, 100c, 100d, 100e, 100f to a smartphone or watch with a text-to-speech algorithm that then audibly reports the reading in the other device 100a, 100b, 100c, 100d, 100e, 100f that is still inserted in the wearer's ear (e.g., audibly), as well as displaying the temperature on the screen of the smartphone or watch.

Figure 9A:
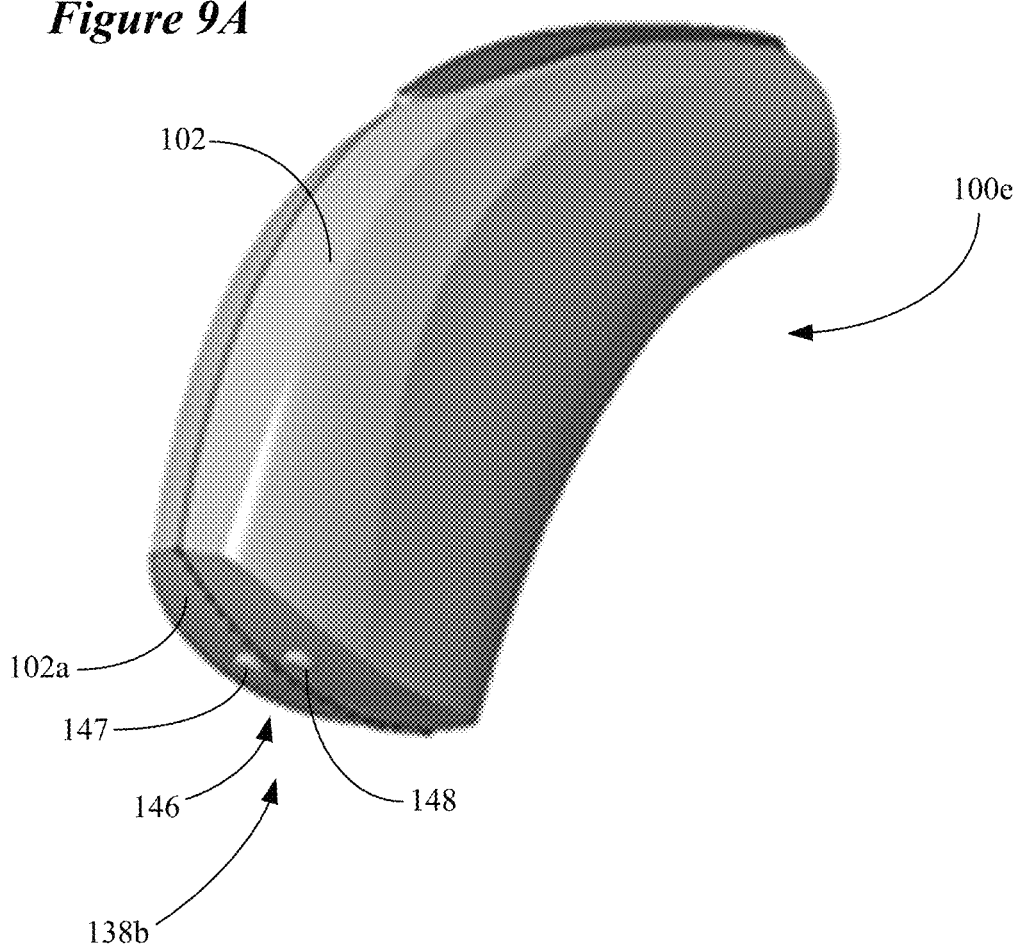
FIGS. 9A and 9B illustrate an ear-worn electronic device which includes a user-actuatable control comprising a touch sensor in accordance with any of the embodiments disclosed herein.
Figure 9B:
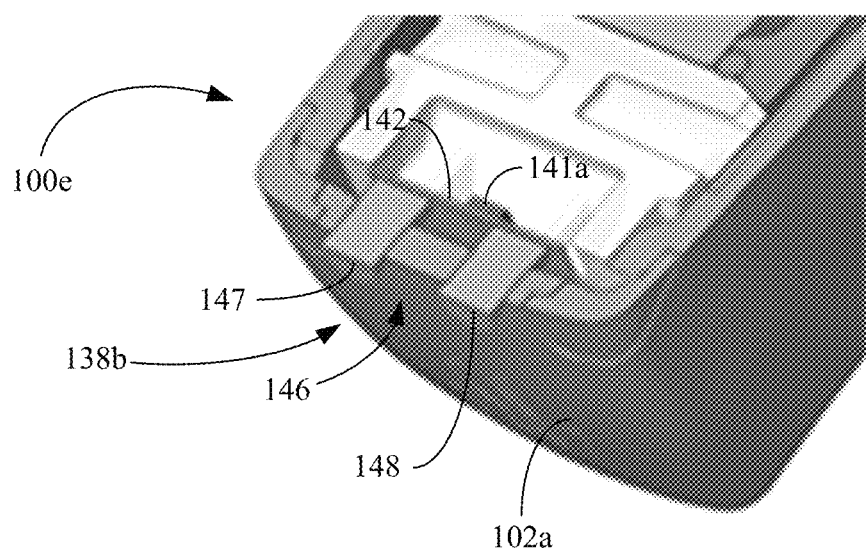

FIGS. 9A and 9B illustrate an ear-worn electronic device 100e which includes a user-actuatable control 132 comprising a touch sensor 138b in accordance with any of the embodiments disclosed herein. The device 100e includes a housing 102 having a behind-the-ear configuration suitable for deployment on the wearer's outer ear. The device 100e can be implemented as a BTE, RIC, or RITE device, for example. The housing 102 includes a rear surface 102a which supports a touch sensor 138b comprising charge contacts 146 (positive and negative contacts 147, 148) and a thermistor 141a, each of which is electrically connected to a circuit board 142. The touch sensor 138b is connected to a touch detection circuit (e.g., circuit 180 shown in FIG. 8) and other components of the device 100e via the circuit board 142.

FIG. 10 is a block diagram of an ear-worn electronic device 100f which includes a user-actuatable control 132 comprising a touch sensor 138 in of accordance with any of the embodiments disclosed herein. As was previously discussed, the device 100f is representative of a wide variety of electronic devices configured to be deployed in, on or about an ear of a wearer. The device 100f shown in FIG. 10 includes several core components previously discussed, including charge contacts 146, charging circuitry 145, rechargeable power source 144, user-actuatable control 132, touch sensor 138, and controller 120.

The device 100f can include a sensor facility 134 which includes one or more sensors which can vary in type and technology. As was previously discussed, the sensor facility 134 can include one or more temperature sensors 134a, motion sensors 134b, optical sensors 134c, electrical sensors 134d, and physiologic sensors 134e. For example, the touch sensor 138 of device 100f can include at least one electrical sensor 134d (impedance sensor) alone or in combination with a temperature sensor 134a (e.g., a thermistor 141a) for detecting touch inputs from a wearer of the device 100f.

In accordance with any of the embodiments disclosed herein, the device 100f can be configured as a hearing device or a hearable which includes an audio processing facility 170. The audio processing facility 170 includes audio signal processing circuitry 176 coupled to a speaker or receiver 172 and optionally to one or more microphones 174 coupled to the audio signal processing circuitry 176. In other embodiments, the device 100f is devoid of the audio processing facility 170. The device 100f can also incorporate a communication facility 130 configured to effect communications with a companion device 100f and/or an external electronic device, system and/or the cloud. The communication facility 130 can include one or both of an RF transceiver/antenna and/or an NFMI transceiver/antenna.

According to embodiments that incorporate the audio processing facility 170, the device 100f can be implemented as a hearing assistance device that can aid a person with impaired hearing. For example, the device 100f can be implemented as a monaural hearing aid or a pair of devices 100f can be implemented as a binaural hearing aid system. The monaural device 100f or a pair of devices 100f can be configured to effect bi-directional communication (e.g., wireless communication) of data with an external source, such as a remote server via the Internet or other communication infrastructure. The device or devices 100f can be configured to receive streaming audio (e.g., digital audio data or files) from an electronic or digital source. Representative electronic/digital sources (e.g., accessory devices) include an assistive listening system, a streaming device (e.g., a TV streamer or audio streamer), a radio, a smartphone, a laptop, a cell phone/entertainment device (CPED) or other electronic device that serves as a source of digital audio data, control and/or settings data or commands, and/or other types of data files.

The controller 120 shown in FIG. 10 (and the controller 120 shown in other figures) can include one or more processors or other logic devices. For example, the controller 120 can be representative of any combination of one or more logic devices (e.g., multi-core processor, digital signal processor (DSP), microprocessor, programmable controller, general-purpose processor, special-purpose processor, hardware controller, software controller, a combined hardware and software device) and/or other digital logic circuitry (e.g., ASICs, FPGAs), and software/firmware configured to implement the functionality disclosed herein. The controller 120 can incorporate or be coupled to various analog components (e.g., analog front-end), ADC and DAC components, and Filters (e.g., FIR filter, Kalman filter). The controller 120 can incorporate or be coupled to memory. The memory can include one or more types of memory, including ROM, RAM, SDRAM, NVRAM, EEPROM, and FLASH, for example.

Figure 11:
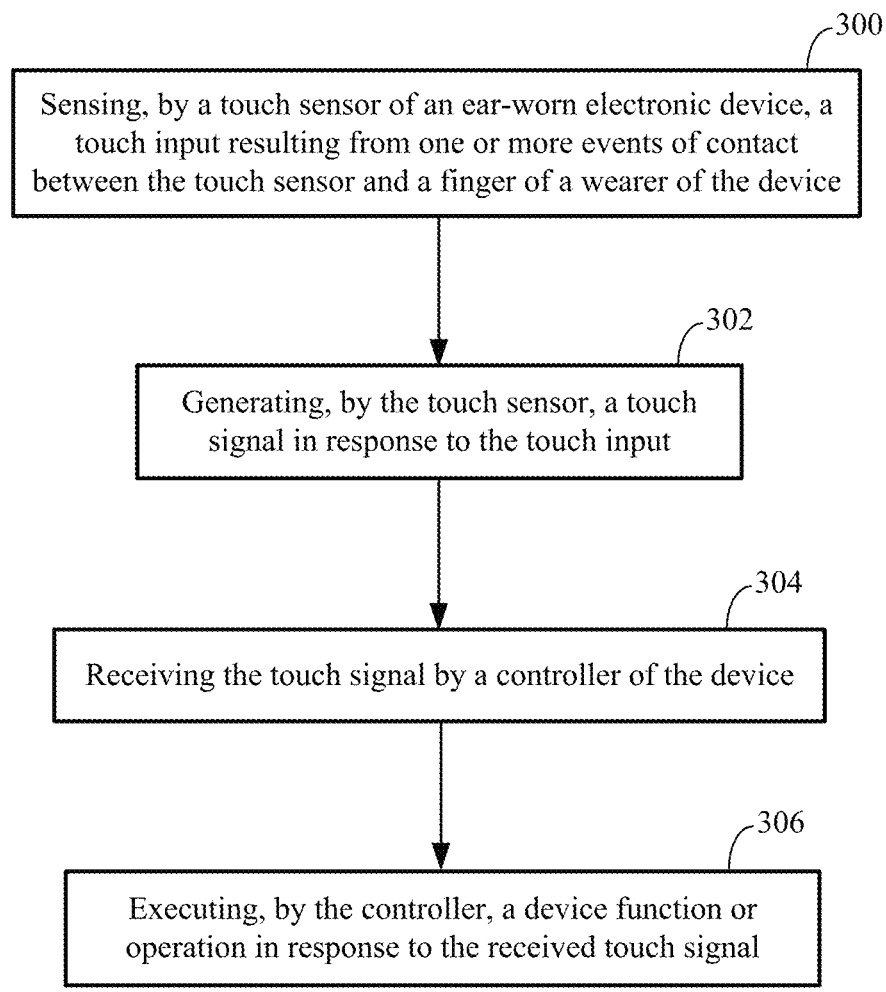
FIG. 11 illustrates a method of controlling an ear-worn electronic device using a user-actuatable control comprising a touch sensor in accordance with any of the embodiments disclosed herein.

FIG. 11 illustrates a method of controlling an ear-worn electronic device using a user-actuatable control comprising a touch sensor in accordance with any of the embodiments disclosed herein. The method shown in FIG. 11 comprises sensing 300, by a touch sensor of the ear-worn electronic device, a touch input resulting from one or more events of contact between the touch sensor and a finger of a wearer of the device. The method comprises generating 302, by the touch sensor, a touch signal in response to the touch input. The method also comprises receiving 304 the touch signal by a controller of the device. The method further comprises implementing, by the controller, a device setting, function or operation in response to the received touch signal. The method shown in FIG. 11 can be implemented by any of the devices 100a, 100b, 100c, 100d, 100e, 100f.

Embodiments of a touch sensor incorporated in an ear-worn electronic device are generally described herein as being coupled to charge contacts of the device. It is understood that, according to some embodiments, a touch sensor of an ear-worn electronic device does not necessarily need to be coupled to or use the charge contacts of the device. For example, cross pins or hinge pins of an ear-worn electronic device can serve as contacts for a touch sensor. In such embodiments, the electrical connections shown between touch sensor 138 and charge contacts 146 in FIGS. 1, 3, 5, 7 and 8 can be excluded. In the embodiments shown in FIGS. 3 and 5 that include an auxiliary sensor 141, the auxiliary sensor 141 can be coupled to the charge contacts 146, the controller 120 or other power source or component.

Moreover, an ear-worn electronic device that incorporates a touch sensor can exclude charge contacts altogether, and may instead incorporate a charger interface configured for wireless charging (e.g., inductive, radio frequency or optical wireless charging). For example, the charger interface of an ear-worn electronic device of the present disclosure can be configured to implement inductive charging in accordance with the Qi open interface standard developed by the Wireless Power Consortium.

With conductivity or capacitive based touch switches, water is a challenging substance to tell apart from a finger. Inductive sensing approaches attempt to solve this problem, but require some amount of force to depress the metal target, instead of almost no force for conductive or capacitive sensing approaches. Additionally, both capacitive and inductive sensing approaches require more power to sense the change in value, whereas a conductivity sensor can operate with many orders of magnitude less power. Because water, sweat, rain and other aqueous solutions have much higher conductivity than skin, it is possible to detect the difference between skin and aqueous solutions, and thus have many fewer less false positives when controlling an ear-worn electronic device in real applications.

Figure 12:
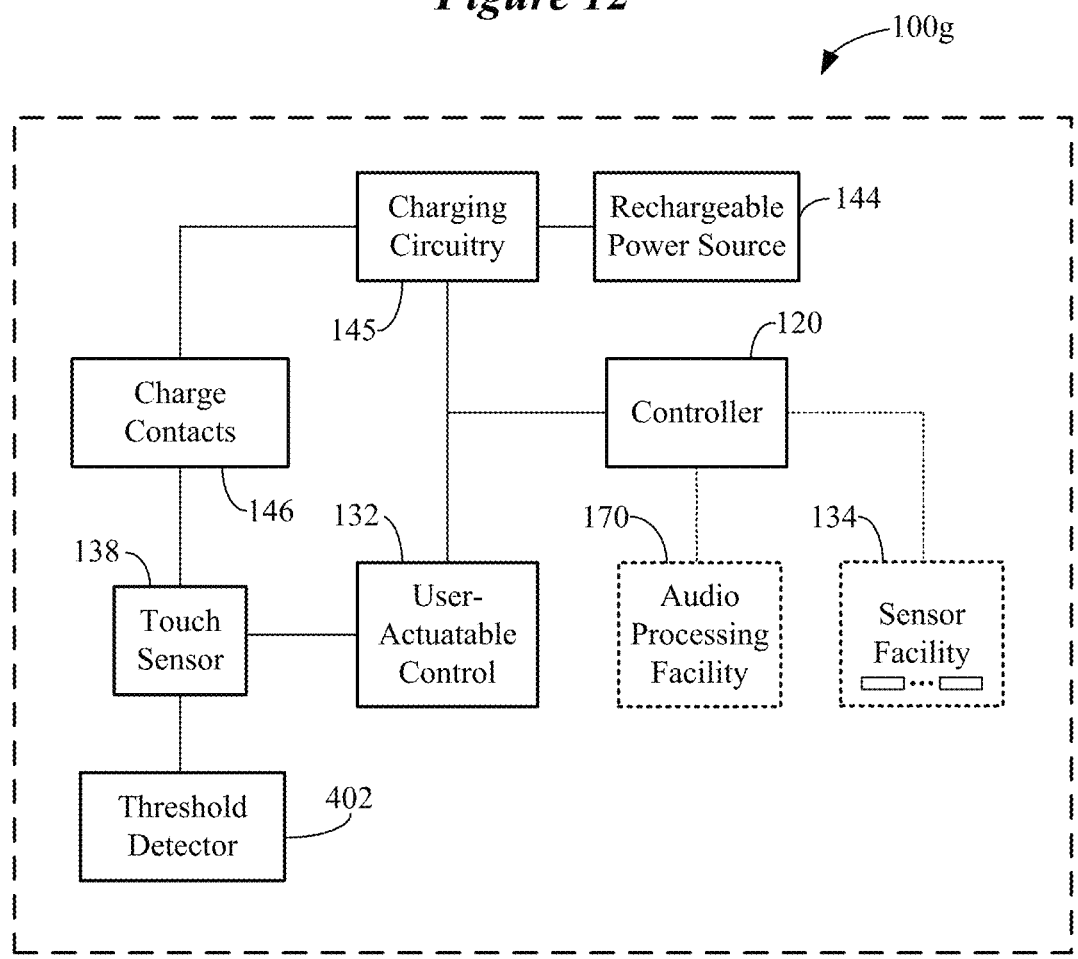
FIG. 12 is a block diagram of an ear-worn electronic device which includes a user-actuatable control comprising a touch sensor and a threshold detector in accordance with any of the embodiments disclosed herein.

FIG. 12 illustrates an ear-worn electronic device 100g which includes a user-actuatable control comprising a touch sensor 138 and a threshold detector 402 in accordance with any of the embodiments disclosed herein. The device 100g can be implemented using the components and processing described above in connection with devices 100a, 100b, 100c, 100d, 100e, 100f. In addition to these components and processing capabilities, the device 100g includes a touch sensor 138 having a threshold detector 402 configured to distinguish between contact with a finger at the charge contacts 146 and presence of a material (e.g., water, sweat) more conductive than skin at the charge contacts 146. It is noted that, in some implementations, the touch sensor 138 and threshold detector 402 need not be coupled to charge contacts 146, but can instead be coupled to touch contacts (e.g., a pair of electrodes). In such implementations, the device 100g need not include a rechargeable power source 144, but can instead include a conventional power source (e.g., a non-rechargeable battery). The device 100g can also be implemented to include touch contacts in addition to separate charge contacts for charging a rechargeable power source of the device 100g.

The ear-worn electronic device 100g shown in FIG. 12 includes a housing 102 configured for deployment in, on or about an ear of a wearer as previously discussed. The device 100g can be configured as a hearing device or a hearable which includes an audio processing facility 170. The audio processing facility 170 can include audio signal processing circuitry, a speaker or a receiver, and optionally one or more microphones. In accordance with any of the embodiments disclosed herein, the device 100g can be implemented as a physiologic (e.g., biometric) monitoring device and include a sensor facility 134. When implemented for physiologic monitoring, the device 100g can include or exclude (e.g., be devoid of) the audio processing facility 170. The device 100g can also incorporate a communication facility configured to effect communications between two of the devices 100g and/or with an external electronic device, system and/or the cloud. The communication facility can include one or both of an RF transceiver/antenna and/or an NFMI transceiver/antenna (see, e.g., device 100f shown in FIG. 10).

The housing 102 is configured to contain or support a number of components including charging circuitry 145 coupled to a rechargeable power source 144 (e.g., a lithium-ion battery) and charge contacts 146. A controller 120 is operatively coupled to the charging circuitry 145 and other components of the device 100g. The charge contacts 146 typically comprise at least one positive contact and at least one negative or ground contact exposed on an exterior surface of the housing 102. When recharging the rechargeable power source 144, the device 100g is typically placed in a charging unit comprising positive and negative charge contacts which electrically couple to corresponding positive and negative charge contacts 146 of the device 100g. The charging circuitry 145 of the device 100g cooperates with charging circuitry of the charging unit to charge the rechargeable power source 144. The charging circuitry 145 of the device 100g can be configured to cooperate with the charging unit in a manner previously described.

The device 100g includes a user-actuatable control 132 comprising, or coupled to, a touch sensor 138. The touch sensor 138 is coupled to the charge contacts 146. In some implementations of the device 100g, the touch sensor 138 can comprise the charge contacts 146 and circuitry of the user-actuatable control 132 (e.g., analog-to-digital converter, signal processing circuitry; see e.g., FIGS. 1, 2, and 8). In other implementations of the device 100g, the touch sensor 138 can comprise the charge contacts 146, one or more auxiliary sensors 141 (e.g., a thermistor) operatively coupled to the charge contacts 146, and circuitry of the user-actuatable control 132 (see e.g., FIGS. 3, 4, and 7). In further implementations, the touch sensor 138 can comprise the charge contacts 146, one or more auxiliary sensors 141 operatively coupled to the controller 120 (but not to the charge contacts 146), and circuitry of the user-actuatable control 132 (see e.g., FIG. 5).

Figure 13:
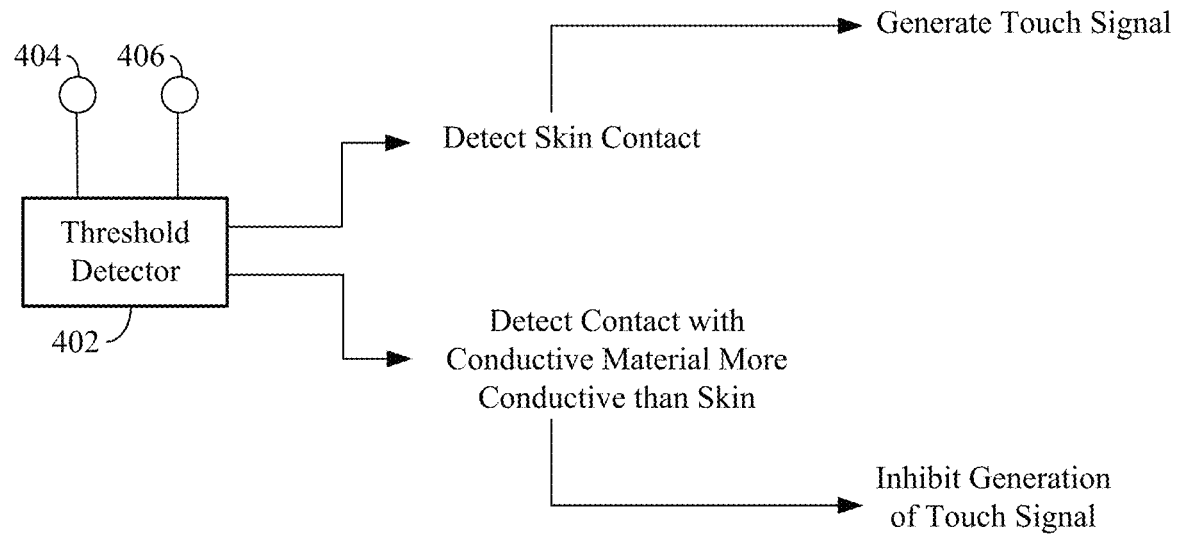
FIG. 13 shows a threshold detector of a touch sensor of an ear-worn electronic device in accordance with any of the embodiments disclosed herein.

Referring now to FIG. 13, there is shown a threshold detector 402 operatively coupled to a pair of touch contacts 404, 406. In some implementations, the touch contacts 404, 406 constitute charge contacts of an ear-worn electronic device which includes a rechargeable power source. In other implementations, the touch contacts 404, 406 constitute a pair of electrodes of an ear-worn electronic device which are not charge contacts. In such implementations, the device can include a rechargeable or a non-rechargeable power source.

The threshold detector 402 shown in FIG. 13 is configured to detect a touch event of unknown origin at first and second touch contacts 404, 406. The threshold detector 402 is configured to distinguish between skin contact with the touch contacts 404, 406 (which can be charge contacts) and contact between the touch contacts 404, 406 and a conductive material more conductive than skin (e.g., water, sweat). In response to detecting skin contact with the touch contacts 404, 406, the threshold detector 402 generates a touch signal. In response to detecting contact between the touch contacts 404, 406 and conductive material more conductive than skin, the threshold detector 402 inhibits generation of a touch signal.

With reference to FIGS. 12 and 13, the controller 120, in response to detection of a touch event of unknown origin, is configured to enable activation of the threshold detector 402 to distinguish between the first range of impedances and a second range of impedances present at the first and second touch contacts 404, 406. The first range of impedances corresponds to a range of impedances associated with unwet skin (referred to herein simply as skin). The second range of impedances corresponds to a range of impedances associated with conductive material more conductive than skin. For example, the first range of impedances can comprise impedances of about 100K to about 300 M Ohm. The second range of impedances can comprise impedances of less than about 100K Ohm.

In some implementations, the threshold detector 402 can be configured to generate a toggle signal between high and low states in response to the first range of impedances present at the first and second touch contacts 404, 406. The threshold detector 402 can be configured to generate a continuous high signal in response to the second range of impedances present at the touch contacts 404, 406. In some implementations, the threshold detector 402 can be configured to generate a continuous low signal in response to a third range of impedances present at the touch contacts 404, 406, where the third range of impedances is greater than the first and second ranges of impedances. In response to detecting the first range of impedances indicative of skin contact with the touch contacts 404, 406, the controller 120 is configured to initiate a device function or operation (or a multiplicity of device functions or operations) associated with the particular type of touch applied to the touch contacts 404, 406 (e.g., single touch, double touch, a sequence of long and short touches, etc.).

Figure 14:
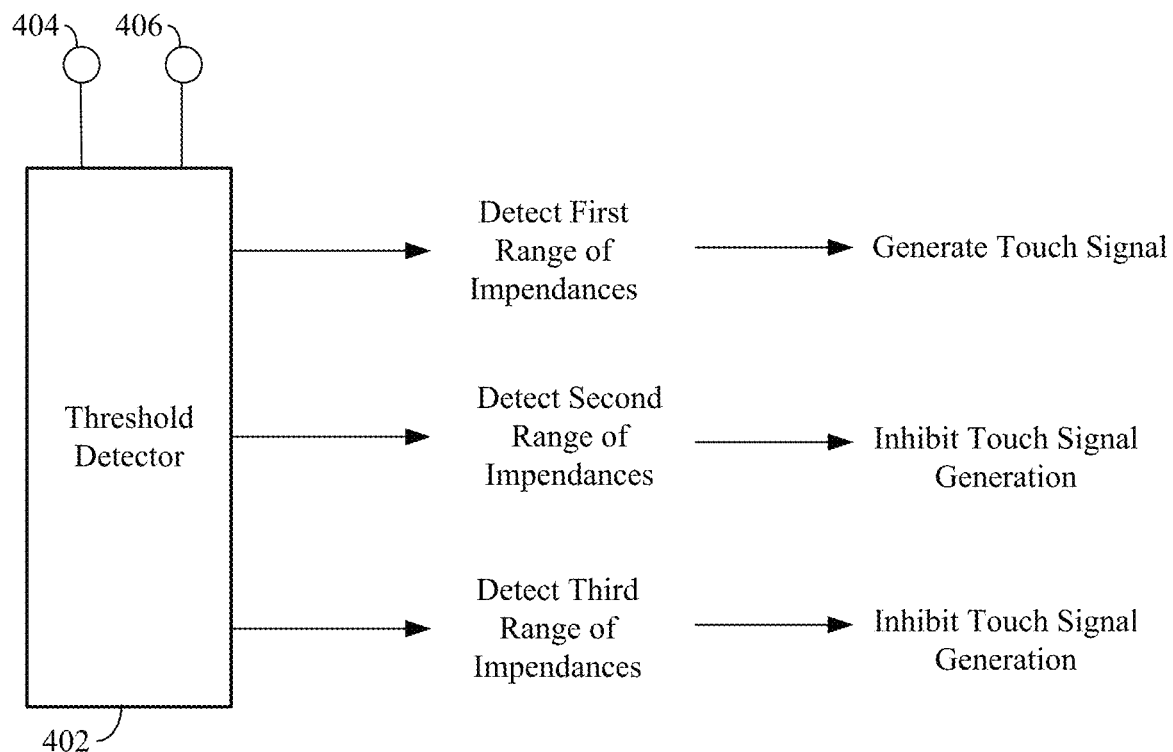
FIG. 14 shows a threshold detector of a touch sensor of an ear-worn electronic device in accordance with any of the embodiments disclosed herein.

Referring now to FIG. 14, the threshold detector 402 can be configured to distinguish between a first, a second, and a third range of impedances respectively present at the first and second touch contacts 404, 406. The threshold detector 402 can be configured to generate a touch signal in response to detecting the first range of impedances present at the touch contacts 404, 406 indicative of skin contact with the touch contacts 404, 406. The threshold detector 402 can be configured to inhibit generation of the touch signal in response to detecting presence of the second and third ranges of impedances at the touch contacts 404, 406.

The first range of impedances detectable by the threshold detector 402 corresponds to impedances associated with skin contact with the touch contacts 404, 406. The second range of impedances corresponds to impedances associated with the conductive material more conductive than skin present at the touch contacts 404, 406. The third range of impedances corresponds to impedances associated with an absence of a contact event at the touch contacts 404, 406. By way of example, the first range of impedances can comprise impedances of about 100K Ohm to about 300 M Ohm. The second range of impedances can comprise impedances of less than about 10K Ohm. The third range of impedances can comprise impedances greater than about 300 M Ohm.

Figure 15:
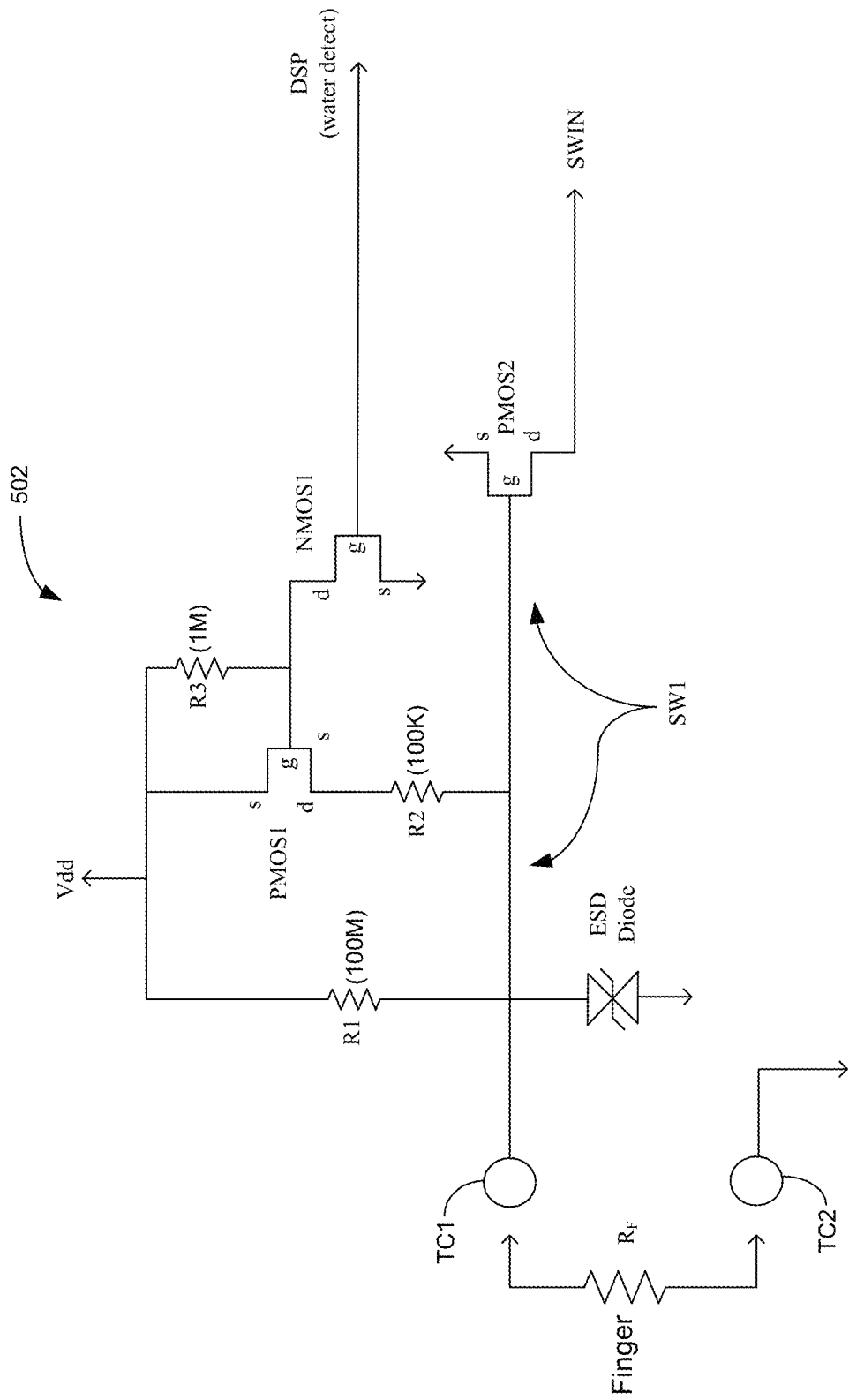
FIG. 15 is a diagram of circuitry which includes a user-actuatable control comprising a touch sensor and a threshold detector in accordance with any of the embodiments disclosed herein.
Figure 16:
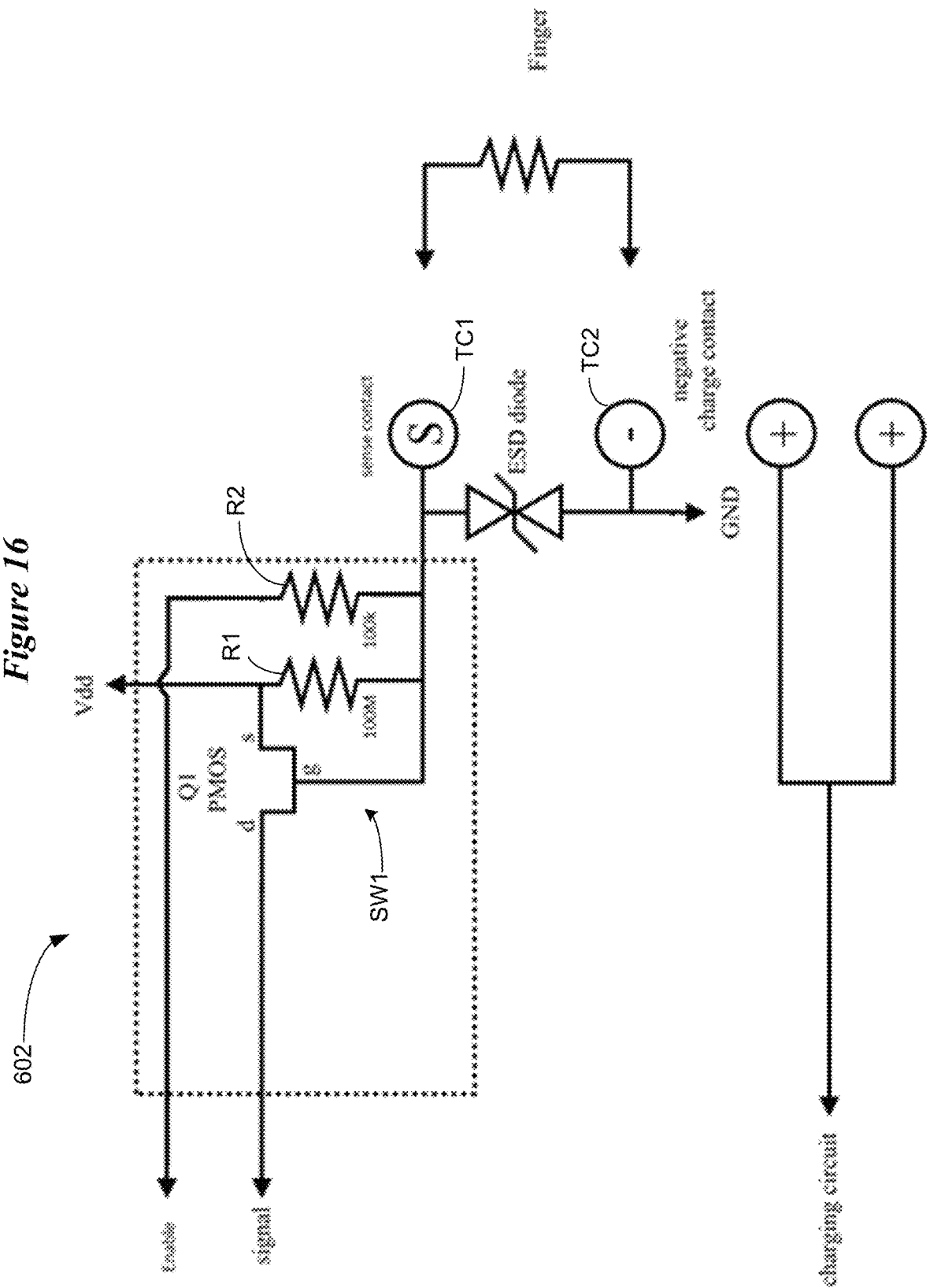
FIG. 16 is a diagram of circuitry which includes a user-actuatable control comprising a touch sensor and a threshold detector in accordance with any of the embodiments disclosed herein.

FIGS. 15 and 16 are schematics of a threshold detector 502, 602 in accordance with any of the embodiments disclosed herein. For the threshold detector 502 shown in FIG. 15, R1 and PMOS2 make up a switch SW1 of the circuit, with the circuit awaiting a finger press to touch contacts TC1, TC2. The ESD diode is arranged to protect PMOS2 from ESD events.

When a finger touches touch contacts TC1, TC2, the impedance is low enough to pull the gate of PMOS2 to GND and turn the switch SW1 ON. The DSP sees SWIN go high and turns the Water Detect pin ON. This turns NMOS1 ON and pulls the gate of PMOS1 to ground, turning PMOS1 ON. Now, the pull up resistance of R1 is 100 M in parallel with R2 of 100 k, which is essentially 100 k. The finger impedance is no longer low enough to pull the gate of PMOS2 low and, as a result, PMOS2 turns OFF. The DSP sees SWIN go low and determines whether a finger is touching touch contacts TC1, TC2 or the touch event was just noise. The DSP then disables the Water Detect pin so that NMOS1 and PMOS1 turn OFF. As a result, the pull-up resistance is increased to 100 M and SWIN goes back high (if a finger is still touching touch contacts TC1, TC2) and the DSP now determines that a finger is pressing the switch SW1. When SWIN goes low, the DSP determines that the finger has been removed from the switch SW1.

When water or other highly conductive material more conductive than unwet skin (e.g., coins, keys; but referred to as water in this example) touches touch contacts TC1, TC2, the impedance is low enough to pull the gate of PMOS2 to GND and turn switch SW1 ON. The DSP sees SWIN go high and turns the Water Detect pin ON. This turns NMOS1 on and pulls the gate of PMOS1 to ground turning it ON. Now, the pull up resistance of R1 is 100 M in parallel with R2 of 100 k, which is essentially 100 k. The water impedance is still low enough to pull the gate of PMOS2 low and PMOS2 stays ON. The DSP sees SWIN stay high and determines that water is touching the switch SW1. The DSP then disables the Water Detect pin so that NMOS1 and PMOS1 turn OFF. As a result, the pull-up resistance is increased to 100 M and SWIN stays high (if water is still present at touch contacts TC1, TC2) and the DSP determines that water is present at the switch SW1. When SWIN goes low, the DSP determines that the water is no longer present at the SW1.

It is noted that threshold detector 602 shown in FIG. 16 operates in essentially the same manner as threshold detector 502 shown in FIG. 15, except the DSP of threshold detector 602 is able to directly enable R2 instead of requiring PMOS1, R3, and NMOS1 due to a lower working voltage of DSP(~1V) relative to Vdd (~4V). It is also noted that the values of R1 and R2 are shown in FIGS. 15 and 16 as 100 M Ohm and 100 K Ohm, respectively. These values can be modified as desired, but were derived empirically. These values were selected after testing fingers of young and old subjects, and, for some subjects, with lotion applied to subjects' hands.

A touch sensor with threshold detection implemented in accordance with the present disclosure provides a number of advantages over capacitive and inductive touch sensing approaches. Notably, conventional capacitive and inductive touch sensors are not immune to aqueous solutions and perform poorly in the presence of same. In contrast, the conductivity-based threshold detector disclosed herein is immune to aqueous solutions by looking for a specific range of impedance (e.g., 100K Ohm to 300 M Ohm) associated with skin of a finger. The conductivity-based threshold detector disclosed herein requires substantially lower power than conventional capacitive and inductive touch sensing approaches. For example, prior to activation, the disclosed conductivity-based threshold detector consumes about a nano-ampere (e.g., almost no current flow), whereas conventional capacitive and inductive touch sensing approaches require on the order of milli- or micro-amperes continuously. Conventional capacitive and inductive touch sensors are significantly larger than the disclosed conductivity-based touch sensor. The conductivity-based threshold detector disclosed herein requires very little tactile force when compared to conventional inductive touch sensors.

The disclosed conductivity-based touch sensor can be used in several different applications. For example, the disclosed conductivity-based touch sensor can be configured as an automatic on/off switch for an ear-worn electronic device. The touch sensor can detect contact between skin of the ear (e.g., ear canal) and the touch contacts upon deployment of the device in the ear canal and, in response, automatically turn the device on. The touch sensor can subsequently detect an absence of contact between skin of the ear and the touch contacts upon removal of the device from the ear canal and, in response, automatically turn the device off.

Although reference is made herein to the accompanying set of drawings that form part of this disclosure, one of at least ordinary skill in the art will appreciate that various adaptations and modifications of the embodiments described herein are within, or do not depart from, the scope of this disclosure. For example, aspects of the embodiments described herein may be combined in a variety of ways with each other. Therefore, it is to be understood that, within the scope of the appended claims, the claimed invention may be practiced other than as explicitly described herein.

All references and publications cited herein are expressly incorporated herein by reference in their entirety into this disclosure, except to the extent they may directly contradict this disclosure. Unless otherwise indicated, all numbers expressing feature sizes, amounts, and physical properties used in the specification and claims may be understood as being modified either by the term "exactly" or "about." Accordingly, unless indicated to the contrary, the numerical parameters set forth in the foregoing specification and attached claims are approximations that can vary depending upon the desired properties sought to be obtained by those skilled in the art utilizing the teachings disclosed herein or, for example, within typical ranges of experimental error.

The recitation of numerical ranges by endpoints includes all numbers subsumed within that range (e.g. 1 to 5 includes 1, 1.5, 2, 2.75, 3, 3.80, 4, and 5) and any range within that range. Herein, the terms "up to" or "no greater than" a number (e.g., up to 50) includes the number (e.g., 50), and the term "no less than" a number (e.g., no less than 5) includes the number (e.g., 5).

The terms "coupled" or "connected" refer to elements being attached to each other either directly (in direct contact with each other) or indirectly (having one or more elements between and attaching the two elements). Either term may be modified by "operatively" and "operably," which may be used interchangeably, to describe that the coupling or connection is configured to allow the components to interact to carry out at least some functionality (for example, a radio chip may be operably coupled to an antenna element to provide a radio frequency electric signal for wireless communication).

Terms related to orientation, such as "top," "bottom," "side," and "end," are used to describe relative positions of components and are not meant to limit the orientation of the embodiments contemplated. For example, an embodiment described as having a "top" and "bottom" also encompasses embodiments thereof rotated in various directions unless the content clearly dictates otherwise.

Reference to "one embodiment," "an embodiment," "certain embodiments," or "some embodiments," etc., means that a particular feature, configuration, composition, or characteristic described in connection with the embodiment is included in at least one embodiment of the disclosure. Thus, the appearances of such phrases in various places throughout are not necessarily referring to the same embodiment of the disclosure. Furthermore, the particular features, configurations, compositions, or characteristics may be combined in any suitable manner in one or more embodiments.

The words "preferred" and "preferably" refer to embodiments of the disclosure that may afford certain benefits, under certain circumstances. However, other embodiments may also be preferred, under the same or other circumstances. Furthermore, the recitation of one or more preferred embodiments does not imply that other embodiments are not useful and is not intended to exclude other embodiments from the scope of the disclosure.

As used in this specification and the appended claims, the singular forms "a," "an," and "the" encompass embodiments having plural referents, unless the content clearly dictates otherwise. As used in this specification and the appended claims, the term "or" is generally employed in its sense including "and/or" unless the content clearly dictates otherwise.

As used herein, "have," "having," "include," "including," "comprise," "comprising" or the like are used in their open-ended sense, and generally mean "including, but not limited to." It will be understood that "consisting essentially of" "consisting of," and the like are subsumed in "comprising," and the like. The term "and/or" means one or all of the listed elements or a combination of at least two of the listed elements.

The phrases "at least one of," "comprises at least one of," and "one or more of" followed by a list refers to any one of the items in the list and any combination of two or more items in the list.

What is claimed is:

1. An ear-worn electronic device, comprising:
   a housing configured to be worn in, at or about an ear of a wearer;
   electronic circuitry disposed in or supported by the housing;
   a controller disposed in the housing and coupled to the electronic circuitry;
   a rechargeable power source and charging circuitry respectively disposed in the housing, the charging circuitry coupled to the controller and comprising first and second charge contacts situated at a wall of the housing; and
   a user-actuatable control operatively coupled to the controller and comprising a touch sensor coupled to the first and second charge contacts, the touch sensor comprising a threshold detector configured to distinguish between skin contact with the first and second charge contacts and contact between a conductive material more conductive than skin and the first and second charge contacts.

2. The device according to claim 1, wherein the touch sensor, via the threshold detector, is configured to generate a touch signal in response to detection of contact between skin and the first and second charge contacts, and to inhibit generation of the touch signal in response to detection of contact between the conductive material and the first and second charge contacts.

3. The device according to claim 1, wherein the threshold detector is configured to distinguish between (1) contact between skin and the first and second charge contacts, (2) contact between the conductive material and the first and second charge contacts; and (3) absence of a touch event at the first and second charge contacts.

4. The device according to claim 1, wherein, in response to detecting a touch event of unknown origin at the first and second charge contacts, the threshold detector is configured to distinguish between skin contact with the first and second charge contacts and contact between the conductive material and the first and second charge contacts.

5. The device according to claim 4, wherein the controller, in response to detection of the touch event of unknown origin, enables activation of the threshold detector to distinguish between at least a first range of impedances and a second range of impedances present at the first and second charge contacts.

6. The device according to claim 5, wherein:
   the first range of impedances corresponds to impedances associated with skin contact with the first and second charge contacts; and
   the second range of impedances corresponds to impedances associated with the conductive material present at the first and second charge contacts.

7. The device according to claim 6, wherein:
   the first range of impedances comprises impedances of about 100K Ohm to about 300 M Ohm; and the second range of impedances comprises impedances of less than about 100K Ohm.

8. The device according to claim 5, wherein the threshold detector is configured to:
generate a toggle signal between high and low states in response to the first range of impedances present at the first and second charge contacts; and
generate a continuous high signal in response to the second range of impedances present at the first and second charge contacts.

9. The device according to claim 8, wherein:
the threshold detector is configured to generate a continuous low signal in response to a third range of impedances present at the first and second charge contacts; and
the third range of impedances is greater than the first and second ranges of impedances.

10. The device according to claim 1, wherein the controller is configured to initiate a device function or operation in response to skin contact with the first and second charge contacts.

11. The device according to claim 1, wherein the controller is configured to initiate a plurality of disparate device functions or operations in response to a corresponding plurality of skin contact events at the first and second charge contacts.

12. An ear-worn electronic device, comprising:
a housing configured to be worn in, at or about an ear of a wearer;
electronic circuitry disposed in or supported by the housing;
a controller disposed in the housing and coupled to the electronic circuitry;
a rechargeable power source and charging circuitry respectively disposed in the housing, the charging circuitry coupled to the controller and comprising first and second charge contacts situated at a wall of the housing; and
a user-actuatable control operatively coupled to the controller and comprising a touch sensor coupled to the first and second charge contacts, the touch sensor comprising a threshold detector configured to:
distinguish between a first, a second, and a third range of impedances respectively present at the first and second charge contacts; and
generate a touch signal in response to detecting the first range of impedances present at the first and second charge contacts.

13. The device according to claim 12, wherein the threshold detector is configured to inhibit generation of the touch signal in response to detecting presence of the second and third ranges of impedances at the first and second charge contacts, respectively.

14. The device according to claim 12, wherein:
the first range of impedances corresponds to impedances associated with skin contact with the first and second charge contacts;
the second range of impedances corresponds to impedances associated with a conductive material more conductive than skin present at the first and second charge contacts; and
the third range of impedances corresponds to impedances associated with an absence of a contact event at the first and second charge contacts.

15. The device according to claim 12, wherein:
the first range of impedances comprises impedances of about 100K Ohm to about 300 M Ohm;
the second range of impedances comprises impedances of less than about 100K Ohm; and
the third range of impedances comprises impedances of greater than about 300 M Ohm.

16. A method implemented by an ear-worn electronic device, comprising:
sensing a touch event of unknown origin by a touch sensor of the device;
activating a threshold detector in response to sensing the touch event;
distinguishing, by the threshold detector, between skin contact with the touch sensor and contact between a conductive material more conductive than skin and the touch sensor; and
initiating a device function or operation in response to the threshold detector detecting skin contact with the touch sensor.

17. The method according to claim 16, comprising generating a touch signal by the touch sensor in response to detecting contact between skin and the touch sensor, and inhibiting generation of the touch signal in response to detecting contact between the conductive material and the first and second charge contacts.

18. The method according to claim 16, comprising distinguishing, by the threshold detector, between (1) contact between skin and the touch sensor, (2) contact between the conductive material and the touch sensor, and (3) absence of a touch event at the touch sensor.

19. The method according to claim 16, wherein activating the threshold detector comprises distinguishing, by the threshold detector, between at least a first range of impedances and a second range of impedances present at the touch sensor.

20. The method according to claim 19, comprising:
generating, by the threshold detector, a toggle signal between high and low states in response to the first range of impedances present at the touch sensor; and
generating, by the threshold detector, a continuous high signal in response to the second range of impedances present at the touch sensor.

21. The method according to claim 20, comprising:
generating, by the threshold detector, a continuous low signal in response to a third range of impedances present at the touch sensor;
wherein the third range of impedances is greater than the first and second ranges of impedances.

22. The method according to claim 19, wherein:
the first range of impedances corresponds to impedances associated with skin contact with the touch sensor; and
the second range of impedances corresponds to impedances associated with the conductive material present at the touch sensor.

23. The method according to claim 22, wherein:
the first range of impedances comprises impedances of about 100K Ohm to about 300 M Ohm; and
the second range of impedances comprises impedances of less than about 100K Ohm.

24. The method according to claim 16, comprising initiating a plurality of device functions or operations in response to the threshold detector detecting skin contact with the touch sensor.

* * * * *